(12) United States Patent
Cha et al.

(10) Patent No.: US 11,292,348 B2
(45) Date of Patent: *Apr. 5, 2022

(54) METHOD AND APPARATUS FOR PERFORMING SWITCHING SYNCHRONIZATION FOR BRIDGELESS RECTIFIER IN ELECTRIC VEHICLE WIRELESS POWER TRANSFER SYSTEM

(71) Applicants: Hyundai Motor Company, Seoul (KR); Kia Motors Corporation, Seoul (KR); Research & Business Foundation Sungkyunkwan University, Gyeonggi-do (KR)

(72) Inventors: Jae Eun Cha, Gyeonggi-do (KR); Woo Young Lee, Gyeonggi-do (KR); Gyu Yeong Choe, Gyeonggi-do (KR); Byoung Kuk Lee, Gyeonggi-do (KR); Jong Eun Byun, Gyeonggi-do (KR); Sang Joon Ann, Gyeonggi-do (KR); Won Jin Son, Gyeonggi-do (KR); Jae Han Lee, Gyeonggi-do (KR)

(73) Assignees: Hyundai Motor Company, Seoul (KR); Kia Motors Corporation, Seoul (KR); Research & Business Foundation Sungkyunkwan University, Gyeonggi-do (KR)

( * ) Notice: Subject to any disclaimer, the term of this patent is extended or adjusted under 35 U.S.C. 154(b) by 286 days.

This patent is subject to a terminal disclaimer.

(21) Appl. No.: 16/428,057

(22) Filed: May 31, 2019

(65) Prior Publication Data
US 2019/0366857 A1     Dec. 5, 2019

(30) Foreign Application Priority Data

Jun. 1, 2018   (KR) .......................... 10-2018-0063507
May 13, 2019  (KR) .......................... 10-2019-0055533

(51) Int. Cl.
*B60L 53/12*     (2019.01)
*B60L 53/20*     (2019.01)
(Continued)

(52) U.S. Cl.
CPC ................ *B60L 53/12* (2019.02); *B60L 53/20* (2019.02); *G01R 19/16542* (2013.01); *G01R 31/3842* (2019.01); *H02J 50/12* (2016.02)

(58) Field of Classification Search
CPC .......... B60L 53/12; B60L 53/20; B60L 53/22; B60L 53/62; B60L 53/66; B60L 53/122;
(Continued)

(56) References Cited

U.S. PATENT DOCUMENTS

2013/0293192 A1* 11/2013 Abe ...................... B60L 15/007
                                                            320/108
2019/0165611 A1*  5/2019 Miyazawa .............. H02M 1/32

* cited by examiner

*Primary Examiner* — Paul Dinh
(74) *Attorney, Agent, or Firm* — Mintz Levin Cohn Ferris Glovsky and Popeo, P.C.; Peter F. Corless

(57) ABSTRACT

A method for performing switching synchronization of a bridgeless rectifier in an electric vehicle (EV) wireless power transfer system may include receiving, by an EV control module, an input voltage of a transmission-side resonance circuit from a transmission-side of the EV wireless power transfer system; calculating, by the EV control module, a phase difference between the received input voltage and a voltage or a current selected in the bridgeless rectifier and a reception-side resonance circuit; and controlling, by an EV control module, switching time points of switches included in the bridgeless rectifier to decrease the calculated phase difference. The reception-side resonance circuit may be electromagnetically coupled to the transmission-side resonance circuit, and the bridgeless rectifier may be configured to rectify an output of the reception-side resonance circuit and to output the rectified output.

6 Claims, 16 Drawing Sheets

(51) Int. Cl.
*G01R 19/165* (2006.01)
*G01R 31/3842* (2019.01)
*H02J 50/12* (2016.01)

(58) Field of Classification Search
CPC . B60L 53/126; B60L 58/12; G01R 19/16542;
G01R 31/3842; H02J 50/12; H02J 7/02;
H02J 7/00032; H02J 50/80; H02J
2207/20; H02J 2310/40; H02J 2310/48;
Y02T 90/12; Y02T 90/14; Y02T 90/16;
Y02T 10/70; Y02T 10/7072
USPC .......................................................... 320/108
See application file for complete search history.

METHOD AND APPARATUS FOR PERFORMING SWITCHING SYNCHRONIZATION FOR BRIDGELESS RECTIFIER IN ELECTRIC VEHICLE WIRELESS POWER TRANSFER SYSTEM

CROSS-REFERENCES TO RELATED APPLICATIONS

The present application claims the benefit of priority to Korean Patent Application No. 10-2018-0063507, filed on Jun. 1, 2018 in the Korean Intellectual Property Office (KIPO), and Korean Patent Application No. 10-2019-0055533, filed on May 13, 2019 in the KIPO, the entire contents of which are incorporated herein by reference.

TECHNICAL FIELD

The present disclosure relates to a method and an apparatus for performing switching synchronization for a bridgeless rectifier in an electric vehicle (EV) wireless power transfer (WPT) system, and more specifically, to a method and an apparatus for controlling switching operations of a reception-side bridgeless rectifier by minimizing information transferred from a transmission-side in an EV WPT system where the bridgeless rectifier is used in a reception-side.

BACKGROUND

An electric vehicle (EV) charging system may be defined as a system for charging a high-voltage battery mounted in an EV using power of an energy storage device or a power grid of a commercial power source. The EV charging system may have various forms according to the type of EV. For example, the EV charging system may be classified as a conductive-type using a charging cable or a non-contact wireless power transfer (WPT)-type (also referred to as an "inductive-type").

When charging an EV wirelessly, a reception coil in a vehicle assembly (VA) mounted in the EV forms an inductive resonant coupling with a transmission coil in a group assembly (GA) located in a charging station or a charging spot. Electric power is then transferred from the GA to the VA to charge the high-voltage battery of the EV through the inductive resonant coupling.

Meanwhile, since a transmission-side and a reception-side included in a WPT system for transferring wireless power to an EV are physically and/or electrically separated from each other, it is necessary to perform synchronized operations through mutual information exchange. When the synchronized operations are not performed between the transmission-side and the reception-side, a resonance frequency may change or a reception-side impedance may not be controlled in a desired manner, degrading the efficiency of the WPT and causing system malfunction and damage to occur. Accordingly, there is a need for a method of performing synchronized operations through minimum information exchange between the transmission-side and the reception-side, or a method of operating the reception-side independently from the transmission-side.

SUMMARY

Embodiments of the present disclosure provide a method, an apparatus, and an EV for performing switching synchronization for a bridgeless rectifier in an EV WPT system.

Also, embodiments of the present disclosure provide a method, an apparatus, and an EV for performing switching synchronization for a bridgeless rectifier in an EV WPT system, independently from a transmission-side.

According to embodiments of the present disclosure, a method for performing switching synchronization of a bridgeless rectifier in an EV WPT system, performed in an EV control module, may include receiving, by an EV control module, an input voltage of a transmission-side resonance circuit from a transmission-side of the EV wireless power transfer system; calculating, by the EV control module, a phase difference between the received input voltage and a voltage or a current selected in the bridgeless rectifier and a reception-side resonance circuit; and controlling, by an EV control module, switching time points of switches included in the bridgeless rectifier to decrease the calculated phase difference. The reception-side resonance circuit may be electromagnetically coupled to the transmission-side resonance circuit, and the bridgeless rectifier may be configured to rectify an output of the reception-side resonance circuit and to output the rectified output.

The bridgeless rectifier may include a first rectifier circuit in which a first diode and a first switch are connected in series and a second rectifier circuit in which a second diode and a second switch are connected in series, and the first rectifier circuit and the second rectifier circuit may be connected in parallel with each other.

The calculating of the phase difference may include calculating, by the EV control module, a phase difference between the received input voltage and the output current of the reception-side resonance circuit.

The output current of the reception-side resonance circuit may be a current flowing in from at least one of a node between the first diode and the first switch and a node between the second diode and the second switch.

The method may further include calculating, by the EV control module, a frequency of the output current of the reception-side resonance circuit; and determining, by the EV control module, the calculated frequency as a switching frequency of the switches.

The calculating of the frequency of the output current of the reception-side resonance circuit may further include detecting, by the EV control module, a zero-crossing point of the output current of the reception-side resonance circuit; generating, by the EV control module, a pulse per the detected zero-crossing point; calculating, by the EV control module, a time interval between rising edges of the generated pulses; and converting, by the EV control module, the calculated time interval to the frequency of the output current of the reception-side resonance circuit.

The method may further include detecting, by the EV control module, an output voltage of an EV battery; comparing, by the EV control module, the detected output voltage with a reference voltage according to a design requirement of the EV battery; and controlling, by the EV control module, a switching duty of the switches according to the comparison of the detected output voltage with the reference voltage.

The controlling of the switching duty may further include controlling, by the EV control module, the switching duty such that the switching duty increases when the output voltage of the EV battery is less than the reference voltage.

The calculating of the phase difference may include calculating, by the EV control module, a phase difference between the received input voltage and a voltage applied to the first switch.

The method may further include calculating, by the EV control module, a frequency according to an operation state of the bridgeless rectifier using the voltage applied to the first switch; and determining, by the EV control module, the calculated frequency as a switching frequency for the switches.

Furthermore, according to embodiments of the present disclosure, a method for performing switching synchronization of a bridgeless rectifier in an EV WPT system independently from a transmission-side of the EV wireless power transfer system may include detecting, by an EV control module, an output voltage and an output current of an EV battery to which energy is transferred from an output of the bridgeless rectifier; calculating, by the EV control module, an output power based on the detected output voltage and output current; and controlling, by the EV control module, switching time points of switches included in the bridgeless rectifier to increase the calculated output power.

The bridgeless rectifier may include a first rectifier circuit in which a first diode and a first switch are connected in series and a second rectifier circuit in which a second diode and a second switch are connected in series, and the first rectifier circuit and the second rectifier circuit may be connected in parallel with each other.

The method may further include calculating, by the EV control module, a frequency of an output current of the reception-side resonance circuit; and determining, by the EV control module, the calculated frequency as a switching frequency of the switches. The bridgeless rectifier may be configured to rectify the output of the reception-side resonance circuit and to output the rectified output.

The calculating of the frequency of the output current of the reception-side resonance circuit may further include detecting, by the EV control module, a zero-crossing point of the output current of the reception-side resonance circuit; generating, by the EV control module, a pulse per the detected zero-crossing point; calculating, by the EV control module, a time interval between rising edges of the generated pulses; and converting, by the EV control module, the calculated time interval to the frequency of the output current of the reception-side resonance circuit.

The method may further include detecting, by the EV control module, an output voltage of an EV battery; comparing, by the EV control module, the detected output voltage with a reference voltage according to a design requirement of the EV battery; and controlling a switching duty of the switches according to the comparison of the detected output voltage with the reference voltage.

The controlling of the switching duty may further include controlling, by the EV control module, the switching duty such that the switching duty increases when the output voltage of the EV battery is less than the reference voltage.

The method may further include calculating, by the EV control module, a frequency according to an operation state of the bridgeless rectifier using the voltage applied to the first switch; and determining, by the EV control module, the calculated frequency as a switching frequency for the switches.

Furthermore, according to embodiments of the present disclosure, an apparatus for performing switching synchronization of a bridgeless rectifier in an EV WPT system may comprise a processor and a memory storing instructions executable by the processor. When the instructions are executed, the processor may be configured to receive an input voltage of a transmission-side resonance circuit from a transmission-side of the EV wireless power transfer system; calculate a phase difference between the received input voltage and a voltage or a current selected in the bridgeless rectifier and a reception-side resonance circuit; and control switching time points of switches included in the bridgeless rectifier to decrease the calculated phase difference. The reception-side resonance circuit may be electromagnetically coupled to the transmission-side resonance circuit, and the bridgeless rectifier may be configured to rectify the output of the reception-side resonance circuit and to output the rectified output.

Furthermore, according to embodiments of the present disclosure, an apparatus for performing switching synchronization of a bridgeless rectifier in an EV wireless power transfer system independently from a transmission-side wireless power transfer system may include a processor and a memory storing instructions executable by the processor. When the instructions are executed, the processor may be configured to detect an output voltage and an output current of an EV battery to which energy is transferred from an output of the bridgeless rectifier; calculate an output power based on the detected output voltage and output current; and control switching time points of switches included in the bridgeless rectifier to increase the calculated output power.

Furthermore, according to embodiments of the present disclosure, an EV for performing switching synchronization of a bridgeless rectifier in an EV WPT system may include a processor; a memory storing instructions executable by the processor; a reception-side resonance circuit coupled with a transmission coil and configured to receive wireless power from the transmission coil; a bridgeless rectifier configured to rectify an output current of the reception-side resonance circuit and to output the rectified current; and an EV battery configured to receive and store the output of the bridgeless rectifier and to supply energy to the EV. When the instructions are executed, the processor may be configured to receive an input voltage of a transmission-side resonance circuit from a transmission-side of the EV wireless power transfer system; calculate a phase difference between the received input voltage and a voltage or a current selected in the bridgeless rectifier and a reception-side resonance circuit; and control switching time points of switches included in the bridgeless rectifier to decrease the calculated phase difference.

Furthermore, according to embodiments of the present disclosure, an EV for independently performing switching synchronization of a bridgeless rectifier in an EV WPT system may include a processor; a memory storing instructions executable by the processor; a reception-side resonance circuit coupled with a transmission coil and configured to receive wireless power from the transmission coil; a bridgeless rectifier configured to rectify an output current of the reception-side resonance circuit and to output the rectified current; and an EV battery configured to receive and store the output of the bridgeless rectifier and to supply energy to the EV. When the instructions are executed, the processor may be configured to detect an output voltage and an output current of an EV battery to which energy is transferred from an output of the bridgeless rectifier; calculate an output power based on the detected output voltage and output current; and control switching time points of switches included in the bridgeless rectifier to increase the calculated output power.

According to the embodiments of the present disclosure, there is no need to exchange synchronization signals for the switching synchronization between the transmission-side and the reception-side, so that they are not affected by communication delays and noises. Further, by exchanging only the minimum information between the transmission-side and the reception-side, it is possible to prevent decrease in the operation speed and reduce the volume of circuits, thereby reducing the cost. Also, according to the embodiments of the present disclosure, there is an advantage that the switching of the bridgeless rectifier can be controlled independently at the reception-side without information exchange between the transmission-side and the reception-side of the wireless power transfer system.

BRIEF DESCRIPTION OF DRAWINGS

Embodiments of the present disclosure will become more apparent by describing in detail embodiments of the present disclosure with reference to the accompanying drawings, in which.

Figure 1:
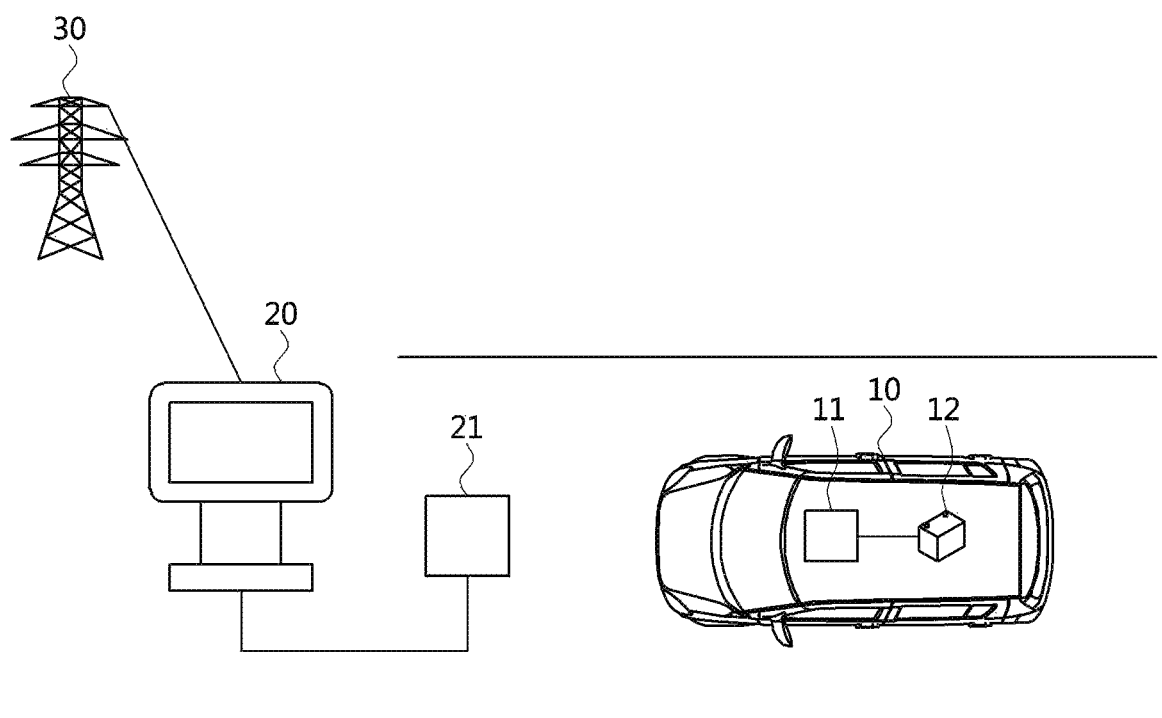
FIG. 1 is a conceptual diagram illustrating a concept of a wireless power transfer (WPT) to which embodiments of the present disclosure are applied.

It should be understood that the above-referenced drawings are not necessarily to scale, presenting a somewhat simplified representation of various preferred features illustrative of the basic principles of the disclosure. The specific design features of the present disclosure, including, for example, specific dimensions, orientations, locations, and shapes, will be determined in part by the particular intended application and use environment.

DETAILED DESCRIPTION OF THE EMBODIMENTS

Embodiments of the present disclosure are disclosed herein. However, specific structural and functional details disclosed herein are merely representative for purposes of describing embodiments of the present disclosure, however, embodiments of the present disclosure may be embodied in many alternate forms and should not be construed as limited to embodiments of the present disclosure set forth herein. While describing the respective drawings, like reference numerals designate like elements.

It will be understood that although the terms "first," "second," etc. may be used herein to describe various components, these components should not be limited by these terms. These terms are used merely to distinguish one element from another. For example, without departing from the scope of the present disclosure, a first component may be designated as a second component, and similarly, the second component may be designated as the first component. The term "and/or" include any and all combinations of one of the associated listed items.

It will be understood that when a component is referred to as being "connected to" another component, it can be directly or indirectly connected to the other component. That is, for example, intervening components may be present. On the contrary, when a component is referred to as being "directly connected to" another component, it will be understood that there is no intervening components.

Terms are used herein only to describe the embodiments but not to limit the present disclosure. Singular expressions, unless defined otherwise in contexts, include plural expressions. In the present specification, terms of "comprise" or "have" are used to designate features, numbers, steps, operations, elements, components or combinations thereof disclosed in the specification as being present but not to exclude possibility of the existence or the addition of one or more other features, numbers, steps, operations, elements, components, or combinations thereof.

All terms including technical or scientific terms, unless being defined otherwise, have the same meaning generally understood by a person of ordinary skill in the art. It will be understood that terms defined in dictionaries generally used are interpreted as including meanings identical to contextual meanings of the related art, unless definitely defined otherwise in the present specification, are not interpreted as being ideal or excessively formal meanings.

Additionally, it is understood that one or more of the below methods, or aspects thereof, may be executed by at least one controller. The term "controller" may refer to a hardware device that includes a memory and a processor. The memory is configured to store program instructions, and the processor is specifically programmed to execute the program instructions to perform one or more processes which are described further below. The controller may control operation of units, modules, parts, devices, or the like, as described herein. Moreover, it is understood that the below methods may be executed by an apparatus comprising the controller in conjunction with one or more other components, as would be appreciated by a person of ordinary skill in the art.

According to embodiments of the present disclosure, an EV charging system may be defined as a system for charging a high-voltage battery mounted in an EV using power of an energy storage device or a power grid of a commercial power source. The EV charging system may have various forms according to the type of EV. For example, the EV charging system may be classified as a conductive-type using a charging cable or a non-contact wireless power transfer (WPT)-type (also referred to as an "inductive-type"). The power source may include a residential or public electrical service or a generator utilizing vehicle-mounted fuel, and the like.

Additional terms used in the present disclosure are defined as follows.

"Electric Vehicle (EV)": An automobile, as defined in 49 CFR 523.3, intended for highway use, powered by an electric motor that draws current from an on-vehicle energy storage device, such as a battery, which is rechargeable from an off-vehicle source, such as residential or public electric service or an on-vehicle fuel powered generator. The EV may be four or more wheeled vehicle manufactured for use primarily on public streets or roads.

The EV may include an electric car, an electric automobile, an electric road vehicle (ERV), a plug-in vehicle (PV), a plug-in vehicle (xEV), etc., and the xEV may be classified into a plug-in all-electric vehicle (BEV), a battery electric vehicle, a plug-in electric vehicle (PEV), a hybrid electric vehicle (HEV), a hybrid plug-in electric vehicle (HPEV), a plug-in hybrid electric vehicle (PHEV), etc.

"Plug-in Electric Vehicle (PEV)": An EV that recharges the on-vehicle primary battery by connecting to the power grid.

"Plug-in vehicle (PV)": An electric vehicle rechargeable through wireless charging from an electric vehicle supply equipment (EVSE) without using a physical plug or a physical socket.

"Heavy duty vehicle (H.D. Vehicle)": Any four-or more wheeled vehicle as defined in 49 CFR 523.6 or 49 CFR 37.3 (bus).

"Light duty plug-in electric vehicle": A three or four-wheeled vehicle propelled by an electric motor drawing current from a rechargeable storage battery or other energy devices for use primarily on public streets, roads and highways and rated at less than 4,545 kg gross vehicle weight.

"Wireless power charging system (WCS)": The system for wireless power transfer and control between the GA and VA including alignment and communications. This system transfers energy from the electric supply network to the electric vehicle electromagnetically through a two-part loosely coupled transformer.

"Wireless power transfer (WPT)": The transfer of electrical power from the AC supply network to the electric vehicle by contactless means.

"Utility": A set of systems which supply electrical energy and may include a customer information system (CIS), an advanced metering infrastructure (AMI), rates and revenue system, etc. The utility may provide the EV with energy through rates table and discrete events. Also, the utility may provide information about certification on EVs, interval of power consumption measurements, and tariff.

"Smart charging": A system in which EVSE and/or PEV communicate with power grid in order to optimize charging ratio or discharging ratio of EV by reflecting capacity of the power grid or expense of use.

"Automatic charging": A procedure in which inductive charging is automatically performed after a vehicle is located in a proper position corresponding to a primary charger assembly that can transfer power. The automatic charging may be performed after obtaining necessary authentication and right.

"Interoperability": A state in which components of a system interwork with corresponding components of the system in order to perform operations aimed by the system. Also, information interoperability may mean capability that two or more networks, systems, devices, applications, or components can efficiently share and easily use information without causing inconvenience to users.

"Inductive charging system": A system transferring energy from a power source to an EV through a two-part gapped core transformer in which the two halves of the transformer, primary and secondary coils, are physically separated from one another. In the present disclosure, the inductive charging system may correspond to an EV power transfer system.

"Inductive coupler": The transformer formed by the coil in the GA Coil and the coil in the VA Coil that allows power to be transferred with galvanic isolation.

"Inductive coupling": Magnetic coupling between two coils. In the present disclosure, coupling between the GA Coil and the VA Coil.

"Ground assembly (GA)": An assembly on the infrastructure side consisting of the GA Coil, a power/frequency conversion unit and GA controller as well as the wiring from the grid and between each unit, filtering circuits, housing(s) etc., necessary to function as the power source of wireless power charging system. The GA may include the communication elements necessary for communication between the GA and the VA.

"Vehicle assembly (VA)": An assembly on the vehicle consisting of the VA Coil, rectifier/power conversion unit and VA controller as well as the wiring to the vehicle batteries and between each unit, filtering circuits, housing(s), etc., necessary to function as the vehicle part of a wireless power charging system. The VA may include the communication elements necessary for communication between the VA and the GA.

The GA may be referred to as a primary device (PD), and the VA may be referred to as a secondary device (SD).

"Primary device (PD)": An apparatus which provides the contactless coupling to the secondary device. That is, the primary device may be an apparatus external to an EV. When the EV is receiving power, the primary device may act as the source of the power to be transferred. The primary device may include the housing and all covers.

"Secondary device (SD)": An apparatus mounted on the EV which provides the contactless coupling to the primary device. That is, the secondary device may be installed in the EV. When the EV is receiving power, the secondary device may transfer the power from the primary to the EV. The secondary device may include the housing and all covers.

"GA controller": The portion of the GA which regulates the output power level to the GA Coil based on information from the vehicle.

"VA controller": The portion of the VA that monitors specific on-vehicle parameters during charging and initiates communication with the GA to control output power level.

The GA controller may be referred to as a primary device communication controller (PDCC), and the VA controller may be referred to as an electric vehicle communication controller (EVCC).

"Magnetic gap": The vertical distance between the plane of the higher of the top of the litz wire or the top of the magnetic material in the GA Coil to the plane of the lower of the bottom of the litz wire or the magnetic material in the VA Coil when aligned.

"Ambient temperature": The ground-level temperature of the air measured at the subsystem under consideration and not in direct sun light.

"Vehicle ground clearance": The vertical distance between the ground surface and the lowest part of the vehicle floor pan.

"Vehicle magnetic ground clearance": The vertical distance between the plane of the lower of the bottom of the litz wire or the magnetic material in the VA Coil mounted on a vehicle to the ground surface.

"VA coil magnetic surface distance": the distance between the plane of the nearest magnetic or conducting component surface to the lower exterior surface of the VA coil when mounted. This distance includes any protective coverings and additional items that may be packaged in the VA coil enclosure.

The VA coil may be referred to as a secondary coil, a vehicle coil, or a receive coil. Similarly, the GA coil may be referred to as a primary coil, or a transmit coil.

"Exposed conductive component": A conductive component of electrical equipment (e.g., an electric vehicle) that may be touched and which is not normally energized but which may become energized in case of a fault.

"Hazardous live component": A live component, which under certain conditions can give a harmful electric shock.

"Live component": Any conductor or conductive component intended to be electrically energized in normal use.

"Direct contact": Contact of persons with live components. (See IEC 61440)

"Indirect contact": Contact of persons with exposed, conductive, and energized components made live by an insulation failure. (See IEC 61140)

"Alignment": A process of finding the relative position of primary device to secondary device and/or finding the relative position of secondary device to primary device for the efficient power transfer that is specified. In the present disclosure, the alignment may direct to a fine positioning of the wireless power transfer system.

"Pairing": A process by which a vehicle is correlated with the unique dedicated primary device, at which it is located and from which the power will be transferred. Pairing may include the process by which a VA controller and a GA controller of a charging spot are correlated. The correlation/association process may include the process of establishment of a relationship between two peer communication entities.

"Command and control communication": The communication between the EV supply equipment and the EV exchanges information necessary to start, control and terminate the process of WPT.

"High-level communication (HLC)": HLC is a special kind of digital communication. HLC is necessary for additional services which are not covered by command & control communication. The data link of the HLC may use a power line communication (PLC), but it is not limited.

"Low-power excitation (LPE)": LPE means a technique of activating the primary device for the fine positioning and pairing so that the EV can detect the primary device, and vice versa.

"Service set identifier (SSID)": SSID is a unique identifier consisting of 32-characters attached to a header of a packet transmitted on a wireless LAN. The SSID identifies the basic service set (BSS) to which the wireless device attempts to connect. The SSID distinguishes multiple wireless LANs. Therefore, all access points (APs) and all terminal/station devices that want to use a specific wireless LAN can use the same SSID. Devices that do not use a unique SSID are not able to join the BSS. Since the SSID is shown as plain text, it may not provide any security features to the network.

"Extended service set identifier (ESSID)": ESSID is the name of the network to which one desires to connect. It is similar to SSID but can be a more extended concept.

"Basic service set identifier (BSSID)": BSSID consisting of 48 bits is used to distinguish a specific BSS. In the case of an infrastructure BSS network, the BSSID may be medium access control (MAC) of the AP equipment. For an independent BSS or ad hoc network, the BSSID can be generated with any value.

The charging station may comprise at least one GA and at least one GA controller configured to manage the at least one GA. The GA may comprise at least one wireless communication device. The charging station may mean a place having at least one GA, which is installed in home, office, public place, road, parking area, etc.

According to embodiments of the present disclosure, "rapid charging" may refer to a method of directly converting AC power of a power system to DC power, and supplying the converted DC power to a battery mounted on an EV. Here, a voltage of the DC power may be DC 500 volts (V) or less.

According to embodiments of the present disclosure, "slow charging" may refer to a method of charging a battery mounted on an EV using AC power supplied to a general home or workplace. An outlet in each home or workplace, or an outlet disposed in a charging stand may provide the AC power, and a voltage of the AC power may be AC 220V or less. Here, the EV may further include an on-board charger (OBC) which is a device configured for boosting the AC power for the slow charging, converting the AC power to DC power, and supplying the converted DC power to the battery.

According to embodiments of the present disclosure, a frequency tuning may be used for performance optimization. Here, the frequency tuning may be performed by a supply device and may not be performed by an EV device. Also, it may be required for all the primary devices to provide the frequency tuning over a full range. In addition, an electric vehicle power controller (EVPC) may operate in a frequency range between 81.38 kHz and 90.00 kHz. A nominal frequency (hereinafter, referred to as a target frequency, a design frequency, or a resonance frequency) for the magnetic field wireless power transfer (MF-WPT) may be 85 kHz. The power supply circuits may provide the frequency tuning.

Hereinafter, embodiments of the present disclosure will be explained in detail by referring to accompanying figures.

FIG. 1 is a conceptual diagram illustrating a concept of a wireless power transfer (WPT) to which embodiments of the present disclosure are applied.

As shown in FIG. 1, a WPT may be performed by at least one component of an electric vehicle (EV) 10 and a charging station 20, and may be used for wirelessly transferring power to the EV 10.

Here, the EV 10 may be usually defined as a vehicle supplying an electric power stored in a rechargeable energy storage including a battery 12 as an energy source of an electric motor which is a power train system of the EV 10.

However, the EV 10 according to embodiments of the present disclosure may include a hybrid electric vehicle (HEV) having an electric motor and an internal combustion engine together, and may include not only an automobile but also a motorcycle, a cart, a scooter, and an electric bicycle.

Also, the EV 10 may include a power reception pad 11 including a reception coil for charging the battery 12 wirelessly and may include a plug connection for conductively charging the battery 12. Here, the EV 10 configured for conductively charging the battery 12 may be referred to as a plug-in electric vehicle (PEV).

Here, the charging station 20 may be connected to a power grid 30 or a power backbone, and may provide an alternating current (AC) power or a direct current (DC) power to a power transmission pad 21 including a transmission coil through a power link.

Also, the charging station 20 may communicate with an infrastructure management system or an infrastructure server that manages the power grid 30 or a power network through wired/wireless communications, and performs wireless communications with the EV 10. Here, the wireless communications may be Bluetooth, ZigBee, cellular, wireless local area network (WLAN), or the like.

Also, for example, the charging station 20 may be located at various places including a parking area attached to the owner's house of the EV 10, a parking area for charging an EV at a gas station, a parking area at a shopping center or a workplace.

A process of wirelessly charging the battery 12 of the EV 10 may begin with first placing the power reception pad 11 of the EV 10 in an energy field generated by the power transmission pad 21, and making the reception coil and the transmission coil be interacted or coupled with each other. An electromotive force may be induced in the power reception pad 11 as a result of the interaction or coupling, and the battery 12 may be charged by the induced electromotive force.

The charging station 20 and the transmission pad 21 may be referred to as a ground assembly (GA) in whole or in part, where the GA may refer to the previously defined meaning.

All or part of the internal components and the reception pad 11 of the EV 10 may be referred to as a vehicle assembly (VA), in which the VA may refer to the previously defined meaning.

Here, the power transmission pad or the power reception pad may be configured to be non-polarized or polarized.

In a case that a pad is non-polarized, there is one pole in a center of the pad and an opposite pole in an external periphery. Here, a flux may be formed to exit from the center of the pad and return at all to external boundaries of the pad.

In a case that a pad is polarized, it may have a respective pole at either end portion of the pad. Here, a magnetic flux may be formed based on an orientation of the pad.

In the present disclosure, the transmission pad 21 or the reception pad 11 may collectively be referred to as a "wireless charging pad".

Figure 2:
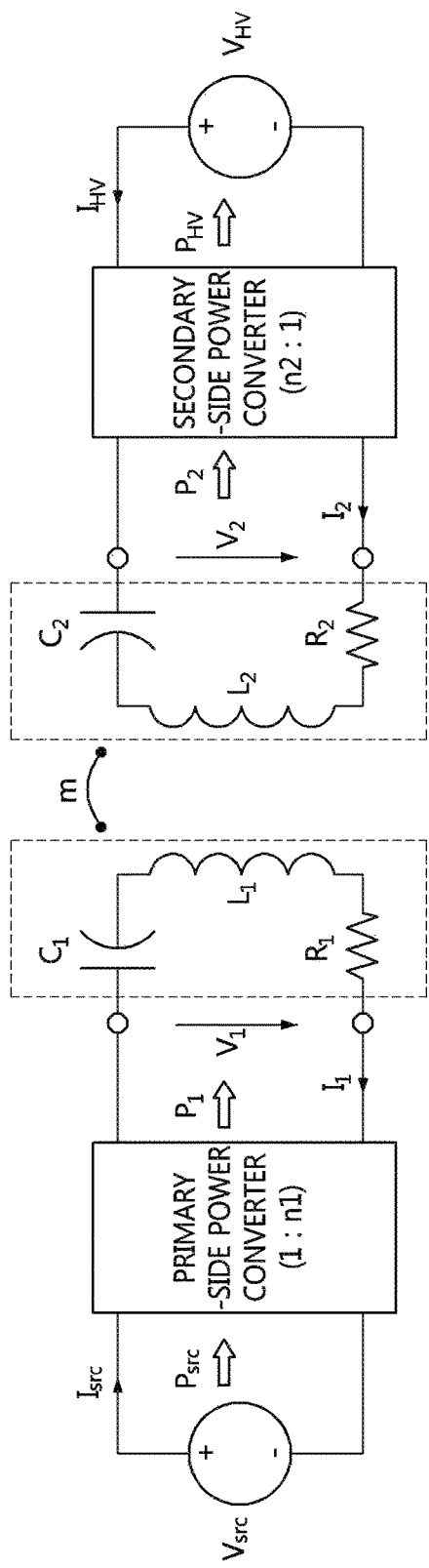
FIG. 2 is a conceptual diagram illustrating a WPT circuit according to embodiments of the present disclosure.

FIG. 2 is a conceptual diagram illustrating a WPT circuit according to embodiments of the present disclosure.

As shown in FIG. 2, a schematic configuration of a circuit in which a WPT is performed in an EV WPT system may be seen.

Here, the left side of FIG. 2 may be interpreted as expressing all or part of a power source $V_{src}$ supplied from the power network, the charging station 20, and the transmission pad 21 in FIG. 1, and the right side of FIG. 2 may be interpreted as expressing all or part of the EV including the reception pad and the battery.

First, the left side circuit of FIG. 2 may provide an output power $P_{src}$ corresponding to the power source $V_{src}$ supplied from the power network to a primary-side power converter. The primary-side power converter may supply an output power $P_1$ converted from the output power $P_{src}$ through frequency-converting and AC-to-DC/DC-to-AC converting to generate an electromagnetic field at a desired operating frequency in a transmission coil $L_1$.

Specifically, the primary-side power converter may include an AC/DC converter for converting the power $P_{src}$ which is an AC power supplied from the power network into a DC power, and a low frequency (LF) converter for converting the DC power into an AC power having an operating frequency suitable for wireless charging. For example, the operating frequency for wireless charging may be determined to be within 80 to 90 kHz.

The power $P_1$ output from the primary-side power converter may be supplied again to a circuit including the transmission coil $L_1$, a first capacitor $C_1$ and a first resistor $R_1$. Here, a capacitance of the first capacitor $C_1$ may be determined as a value to have an operating frequency suitable for charging together with the transmission coil $L_1$. Here, the first resistor $R_1$ may represent a power loss occurred by the transmission coil $L_1$ and the first capacitor $C_1$.

Further, the transmission coil $L_1$ may be made to have electromagnetic coupling, which is defined by a coupling coefficient m, with the reception coil $L_2$ so that a power $P_2$ is transmitted, or the power $P_2$ is induced in the reception coil $L_2$. Therefore, the meaning of power transfer in the present disclosure may be used together with the meaning of power induction.

Still further, the power $P_2$ induced in or transferred to the reception coil $L_2$ may be provided to a secondary-side power converter. Here, a capacitance of a second capacitor $C_2$ may be determined as a value to have an operating frequency suitable for wireless charging together with the reception coil $L_2$, and a second resistor $R_2$ may represent a power loss occurred by the reception coil $L_2$ and the second capacitor $C_2$.

The secondary-side power converter may include an LF-to-DC converter that converts the supplied power $P_2$ of a specific operating frequency to a DC power having a voltage level suitable for the battery $V_{HV}$ of the EV.

The electric power $P_{HV}$ converted from the power $P_2$ supplied to the secondary-side power converter may be output, and the power $P_{HV}$ may be used for charging the battery $V_{HV}$ disposed in the EV.

The right side circuit of FIG. 2 may further include a switch for selectively connecting or disconnecting the reception coil $L_2$ with the battery $V_{HV}$. Here, resonance frequencies of the transmission coil $L_1$ and the reception coil $L_2$ may be similar or identical to each other, and the reception coil $L_2$ may be positioned near the electromagnetic field generated by the transmission coil $L_1$.

The circuit of FIG. 2 should be understood as an illustrative circuit for WPT in the EV WPT system used for embodiments of the present disclosure, and is not limited to the circuit illustrated in FIG. 2.

On the other hand, since the power loss may increase as the transmission coil $L_1$ and the reception coil $L_2$ are located at a long distance, it may be an important factor to properly set the relative positions of the transmission coil $L_1$ and the reception coil $L_2$.

The transmission coil $L_1$ may be included in the transmission pad 21 in FIG. 1, and the reception coil $L_2$ may be included in the reception pad 11 in FIG. 1. Also, the transmission coil may be referred to also as a GA coil, and the reception coil may be referred to also as a VA coil. Therefore, positioning between the transmission pad and the reception pad or positioning between the EV and the transmission pad will be described below with reference to the drawings.

Figure 3:
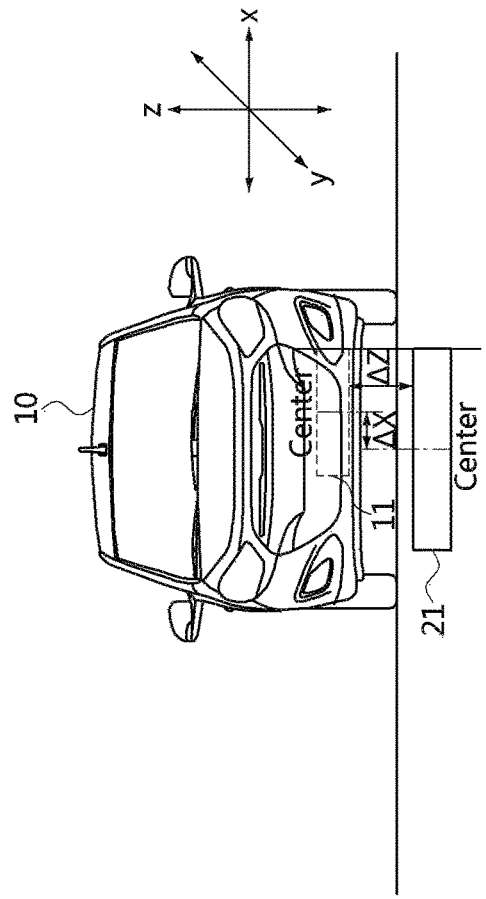
FIG. 3 is a conceptual diagram for explaining a concept of alignment in an EV WPT according to embodiments of the present disclosure.

FIG. 3 is a conceptual diagram for explaining a concept of alignment in an EV WPT according to embodiments of the present disclosure.

As shown in FIG. 3, a method of aligning the power transmission pad 21 and the power reception pad 11 in the EV in FIG. 1 will be described. Here, positional alignment may correspond to the alignment, which is the above-mentioned term, and thus may be defined as positional alignment between the GA and the VA, but is not limited to the alignment of the transmission pad and the reception pad.

Although the transmission pad 21 is illustrated as positioned below a ground surface as shown in FIG. 3, the transmission pad 21 may also be positioned on the ground surface, or positioned such that a top portion surface of the transmission pad 21 is exposed below the ground surface.

The reception pad 11 of the EV may be defined by different categories according to its heights (defined in the z-direction) measured from the ground surface. For example, a class 1 for reception pads having a height of 100-150 millimeters (mm) from the ground surface, a class 2 for reception pads having a height of 140-210 mm, and a class 3 for reception pads having a height of 170-250 mm may be defined. Here, the reception pad may support a part of the above-described classes 1 to 3. For example, only the class 1 may be supported according to the type of the reception pad 11, or the class 1 and 2 may be supported according to the type of the reception pad 11.

The height of the reception pad measured from the ground surface may correspond to the previously defined term "vehicle magnetic ground clearance."

Further, the position of the power transmission pad 21 in the height direction (i.e., defined in the z-direction) may be determined to be located between the maximum class and the minimum class supported by the power reception pad 11. For example, when the reception pad supports only the class 1 and 2, the position of the power transmission pad 21 may be determined between 100 and 210 mm with respect to the power reception pad 11.

Still further, a gap between the center of the power transmission pad 21 and the center of the power reception pad 11 may be determined to be located within the limits of the horizontal and vertical directions (defined in the x- and y-directions). For example, it may be determined to be located within ±75 mm in the horizontal direction (defined in the x-direction), and within ±100 mm in the vertical direction (defined in the y-direction).

Here, the relative positions of the power transmission pad 21 and the power reception pad 11 may be varied in accordance with their experimental results, and the numerical values should be understood as exemplary.

Although the alignment between the pads is described on the assumption that each of the transmission pad 21 and the reception pad 11 includes a coil, more specifically, the alignment between the pads may mean the alignment between the transmission coil (or GA coil) and the reception coil (or VA coil) which are respectively included in the transmission pad 21 and the reception pad 11.

Figure 4:
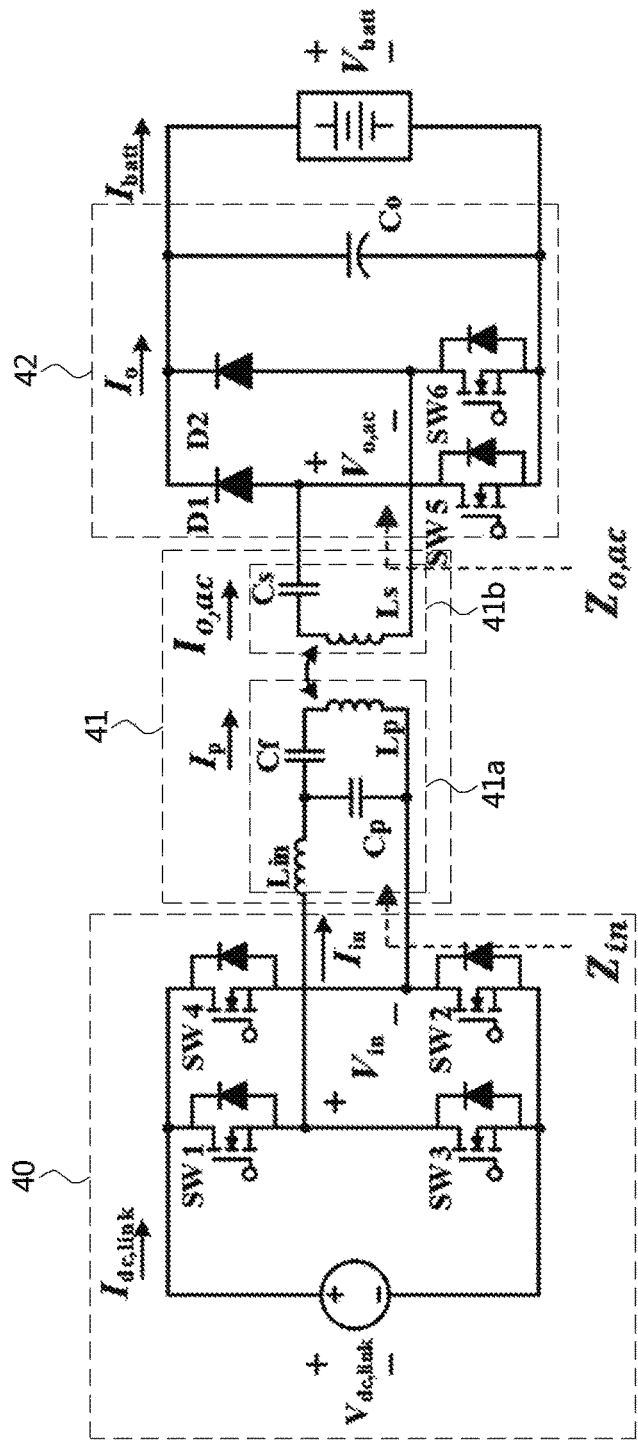
FIG. 4 is a circuit diagram illustrating a WPT system according to embodiments of the present disclosure.

FIG. 4 is a circuit diagram illustrating a WPT system according to embodiments of the present disclosure.

As shown in FIG. 4, a WPT system according to embodiments of the present disclosure includes a full bridge inverter 40 that receives a DC power $V_{dc,link}$ and outputs an AC voltage $V_{in}$, a compensation circuit 41 that receives the AC voltage from the full bridge inverter 40 and generates an induced electromotive force in a reception coil built in a reception pad of an EV, a bridgeless rectifier 42 that outputs a current $I_o$ by rectifying an induced current $I_{o,ac}$ according to the induced electromotive force and stores the current $I_o$ in a capacitor $C_o$, and an EV battery $V_{batt}$ that receives an energy stored in the capacitor $C_o$ of the bridgeless rectifier 42. Here, a DC-to-DC converter for converting a voltage according to the capacitor of the bridgeless rectifier to a voltage according to the EV battery may be connected in parallel with the EV battery.

Here, the full bridge inverter 40 may include a first series circuit and a second series circuit connected in parallel with the DC power supply $V_{dc,link}$. Here, the first series circuit may be a circuit in which a first switch SW1 and a third switch SW3 are connected in series. The second series circuit may be a circuit in which a fourth switch SW4 and a second switch SW2 are connected in series. Also, the full bridge inverter 40 may supply a voltage difference $V_{in}$ between a node $V_{in+}$ between the first switch SW1 and the third switch SW3 and a node $V_{in-}$ between the fourth switch SW4 and the second switch SW2 as an input voltage $V_{in}$ (or, referred to also as a "transmission-side input voltage") of the compensation circuit 41. Here, MOSFET switches may be used as the switches used in the full bridge inverter 40. Further, each switch may be connected in parallel with a diode.

Here, the compensation circuit 41 may be connected to the input voltage $V_{in}$ delivered by the full bridge inverter 40, and may include a transmission-side resonance circuit 41a of LCCL type in which two inductors $L_{in}$ and $L_p$ and two capacitors $C_f$ and $C_p$ are connected in series and in parallel with each other (here, the inductor and the capacitor are connected in series) and a reception-side resonance circuit 41b which outputs an induced current $I_{o,ac}$ generated in a reception-side by an electromotive force induced from the transmission-side resonance circuit. Here, the LCCL type transmission-side resonance circuit 41a may include an input inductor $L_{in}$ and a first capacitor $C_p$ connected in series to the input voltage, and may further include a circuit connected in parallel with the first capacitor $C_p$, in which a second capacitor $C_f$ and a transmission coil $L_p$ are connected in series.

In the reception-side resonance circuit 41b, a reception coil $L_s$ magnetically coupled to the transmission coil $L_p$ (here, mutual inductance thereof is defined as M), where an electromotive force is induced, and a reception capacitor $C_s$ may be connected in series.

Here, the bridgeless rectifier 42 may include a first rectifier circuit in which a first diode D1 and a fifth switch SW5 are connected in series and a second rectifier circuit in which a second diode D2 and a sixth switch SW6 are connected in series, and the first rectifier circuit and the second rectifier circuit may be connected in parallel with each other. Also, the induced current $I_{o,ac}$ of the compensation circuit 41 (or, a current induced in the reception-side resonance circuit) may be input through a node $V_{o,ac+}$ between the first diode D1 and fifth switch SW5 and/or a node $V_{o,ac-}$ between the second diode D2 and the sixth switch SW6. Also, a voltage difference $V_{o,ac}$ between the node $V_{o,ac+}$ between the first diode D1 and fifth switch SW5 and/or the node $V_{o,ac-}$ between the second diode D2 and the sixth switch SW6 may be applied as an input voltage to the bridgeless rectifier 42. In this case, the voltage difference $V_{o,ac}$ between the node $V_{o,ac+}$ between the first diode D1 and fifth switch SW5 and/or the node $V_{o,ac-}$ between the second diode D2 and the sixth switch SW6 may be referred to as an output voltage of the reception-side resonance circuit 41b or a reception-side output voltage.

Here, the bridgeless rectifier 42 may store a current $I_o$ rectified from the first rectifier circuit and/or the second rectifier circuit in a capacitor $C_o$ connected in parallel with the first rectifier circuit and the second rectifier circuit.

Here, since the bridgeless rectifier 42 is structurally capable of only a boosting operation, in order to cope with the output voltage $V_{batt}$ varying depending on the coupling coefficient, a DC link voltage control may be required to obtain a desired output voltage according to the transmission-side DC input voltage $V_{dc,link}$ or $V_{in}$.

On the other hand, the circuits of the WPT system are not necessarily limited to the configuration according to FIG. 4. For example, the resonance circuits of the compensation circuit 41 may be implemented in parallel, or other inverters such as a half bridge inverter may be used instead of the full bridge inverter.

In addition, the WPT system according to FIG. 4 illustrates the transmission-side (or, primary-side) of the WPT system and the reception-side (or, secondary-side) of the WPT system together in terms of a simple circuit diagram. For the purpose of simplicity, the transmission-side of the WPT system and the reception-side of the WPT system may be herein referred to "transmission-side" and "reception-side," respectively. The full bridge inverter 40 and the transmission-side resonance circuit 41a may be included in the charging station 20 and/or the transmission pad 21 according to FIG. 1, and the reception-side resonance circuit 41b and the bridgeless rectifier 42 may be included in the EV 10 and/or the reception pad 11 of the EV 10 according to FIG. 1.

Figure 5:
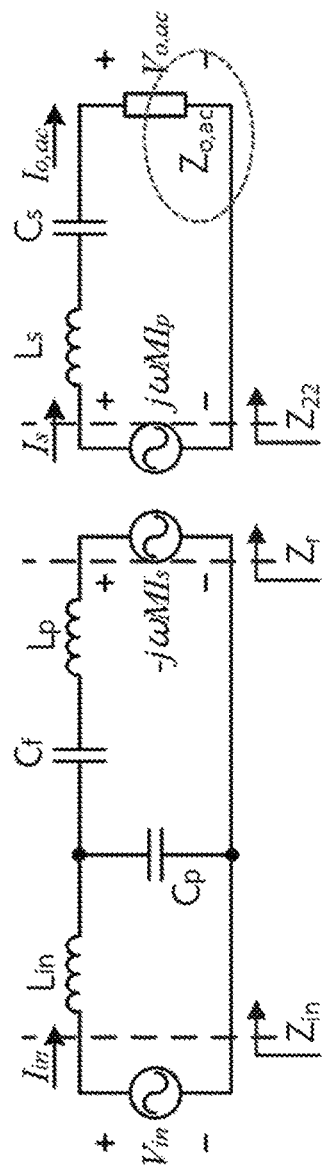
FIG. 5 is an equivalent circuit diagram of a WPT system implementing a bridgeless rectifier in a reception-side of the WPT system according to FIG. 4.

FIG. 5 is an equivalent circuit diagram of a WPT system implementing a bridgeless rectifier in a reception-side according to FIG. 4.

In the WPT system according to FIG. 4, the front end of the compensation circuit, which includes the full bridge inverter, may be substituted with an equivalent voltage $V_{in}$ and an equivalent current $I_{in}$, and the rear end of the compensation circuit, which includes the bridgeless rectifier and the EV battery, may be substituted with a reception-side equivalent output impedance $Z_{o,ac}$, so that an equivalent circuit diagram according to FIG. 5 may be derived. In FIG. 5, a component $-jwMI_s$ and a component $jwMI_p$ may represent a mutual inductance M according to FIG. 4 in frequency domain (or, Fourier domain). Also, a voltage applied to the reception-side equivalent output impedance may be referred to as a reception-side equivalent output voltage $V_{o,ac}$ which has the same meaning as the reception-side output voltage according to FIG. 4.

In FIG. 5, the reception-side equivalent output impedance $Z_{o,ac}$ for the rear end of the compensation circuit may be defined as shown in Equation 1 below.

$$Z_{o,ac} = \frac{V_{o,ac1}}{I_{o,ac1}} = R + jX \qquad \text{[Equation 1]}$$

In FIG. 5, a reception-side equivalent impedance $Z_{22}$ may be calculated as shown in Equation 2 below.

$$Z_{22} = j\omega L_s + \frac{1}{j\omega C_s} + R + jX \qquad \text{[Equation 2]}$$

Referring to Equation 2, since the reception-side equivalent impedance $Z_{22}$ includes the reception-side equivalent output impedance $Z_{o,ac}$ according to Equation 1, the reception-side equivalent impedance $Z_{22}$ may be changed when the reception-side equivalent output impedance $Z_{o,ac}$ changes.

In FIG. 5, the reception-side equivalent impedance $Z_r$ projected (or, reflected) to the transmission-side may be calculated as shown in Equation 3 below.

$$Z_r = \frac{\omega^2 M^2}{Z_{22}} = \frac{\omega^2 M^2}{j\omega L_s + \frac{1}{j\omega C_s} + R + jX} \qquad \text{[Equation 3]}$$

Referring to Equation 3, since the reception-side equivalent impedance $Z_r$ projected to the transmission-side (or, referred to as a reflected impedance) also includes the equivalent output impedance $Z_{o,ac}$ in its denominator, the reception-side equivalent impedance $Z_r$ reflected to the transmission-side may be changed when the reception-side equivalent output impedance $Z_{o,ac}$ changes.

In FIG. 5, the transmission-side equivalent impedance $Z_{in}$ may be as shown in Equation 4 below.

$$Z_{in} = j\omega L_{in} + \frac{1}{\frac{1}{j\omega C_p} + \frac{1}{\frac{1}{j\omega C_f} + j\omega L_p + Z_r}} \qquad \text{[Equation 4]}$$

Referring to Equation 4, since the transmission-side equivalent impedance $Z_{in}$ includes the reflected impedance $Z_r$ according to Equation 3 and the reflected impedance $Z_r$ is affected by variations of the reception-side equivalent output impedances $Z_{o,ac}$, the transmission-side equivalent impedance $Z_{in}$ may also be changed in accordance with the reception-side equivalent output impedance $Z_{o,ac}$.

That is, by integrating Equations 1 to 4, when the reception-side equivalent output impedance $Z_{o,ac}$ is controlled, not only the reception-side equivalent impedance but also the transmission-side equivalent impedance (or, reflected impedance) may be changed. Thus, a transmission-side resonance frequency and a reception-side resonance frequency may be controlled to coincide with each other.

Further, the reception-side equivalent output impedance $Z_{o,ac}$ can be controlled by controlling a switching time point and a duty of the bridgeless rectifier of FIG. 4. Therefore, by using the bridgeless rectifier in the reception-side of the EV WPT system and controlling the switching time point and duty of the bridgeless rectifier, the variation of the transmission-side resonance frequency and the reception-side resonance frequency (i.e., a variation due to a positional change of the transmission and reception pads or a variation of the output voltage depending on a change of coupling coefficient) can be compensated.

Figure 6A:
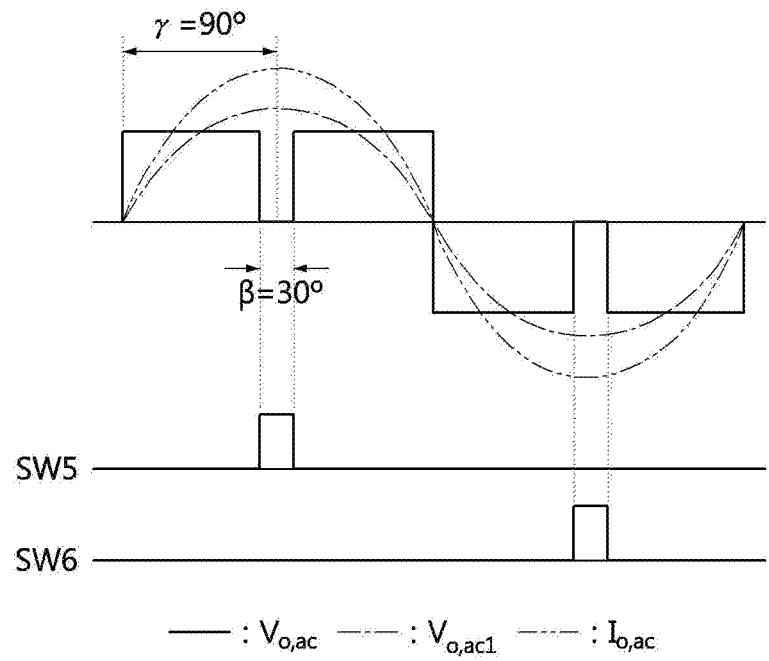
FIGS. 6A and 6C are diagrams explaining a method of controlling an equivalent output impedance by controlling a switching time point and a duty of a bridgeless rectifier.
Figure 6B:
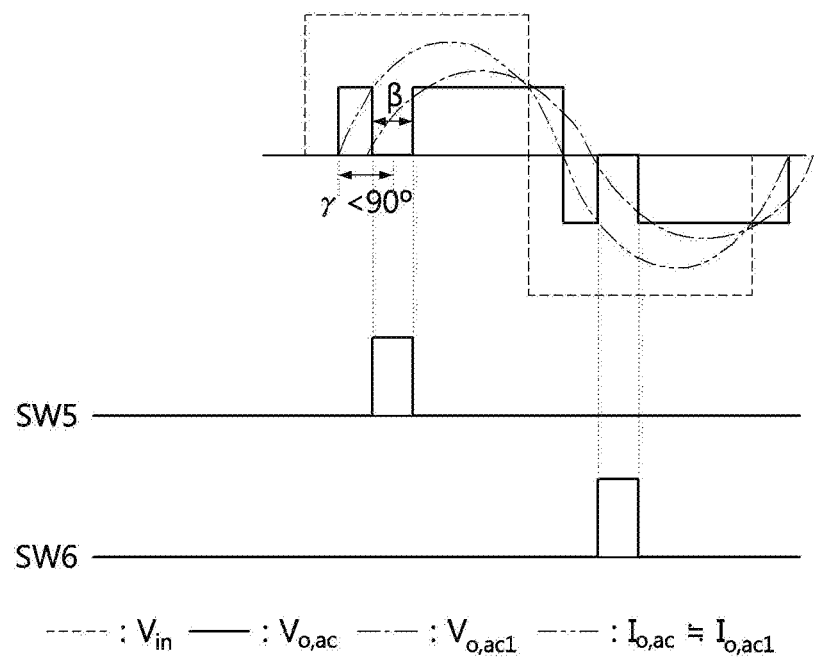
Figure 6C:
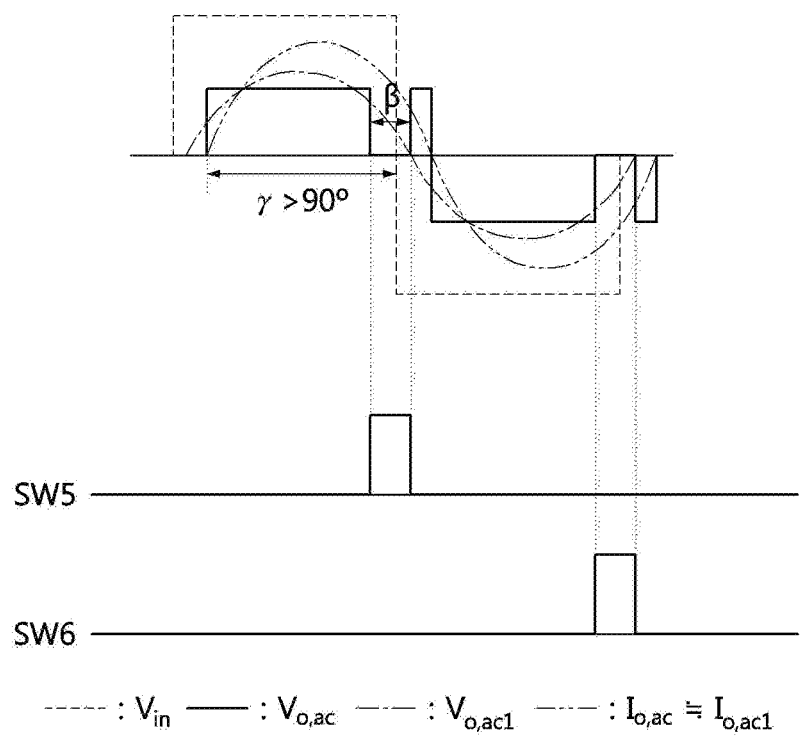

FIGS. 6A and 6C are diagrams explaining a method of controlling an equivalent output impedance by controlling a switching time point and a duty of a bridgeless rectifier.

In FIGS. 6A to 6C, $V_{o,ac1}$ may denote a fundamental wave of the reception-side output voltage $V_{o,ac}$ according to FIG. 4, and $I_{o,ac1}$ may denote a fundamental wave of the reception-side induced current $I_{o,ac}$ according to FIG. 4. The other symbols may be interpreted as being the same as the symbols according to FIG. 4, and the same meanings will be applied in the following graphs unless otherwise specified.

In the following description, for the convenience of explanation, the full bridge inverter 40 of the WPT system according to FIG. 4 may be assumed to be controlled at a duty ratio of 50%, and the switching frequencies of the four switches SW1, SW2, SW3, and SW4 included in the full bridge inverter 40 may be assumed to be controlled in accordance with the transmission-side resonance frequency, so that the input voltage $V_{in}$ and the input current $I_{in}$ for the transmission-side resonance circuit 41a of FIG. 4 are in the same phase (or, have the same phase) (i.e., zero phase angle (ZPA) operation). However, embodiments of the present disclosure are not applicable only under such the assumption. That is, the embodiments of the present disclosure should be construed as being applicable to other control situations of the full bridge inverter 40 as well.

A variable for controlling the switching duty of the switches (i.e., the fifth switch and the sixth switch) included in the bridgeless rectifier of FIG. 4 may be defined as β [degrees]. Here, the variable β may mean a phase interval for which the value of the reception-side output voltage $V_{o,ac}$ is controlled to be 0. Also, when the switching duty of the bridgeless rectifier is changed, the energy transferred from the bridgeless rectifier 40 to the EV battery $V_{batt}$ shown in FIG. 4 may also be changed. Therefore, the switching duty of the bridgeless rectifier may be controlled so as to compensate for the voltage fluctuation of the EV battery due to a change of an alignment state between the transmission pad and the reception pad. Since the control variable β (or the switching duty of the bridgeless rectifier) is utilized to compensate for the voltage fluctuation of the EV battery, the voltage $V_{batt}$ and current $I_{batt}$ of the EV battery are measured and based on the measured voltage and/or current, the switching duty of the bridgeless rectifier may be controlled. For example, the switching duty of the bridgeless rectifier (or control variable β) may be primarily controlled so that the measured current $I_{batt}$ of the EV battery is constant (e.g., 10 A) (i.e., constant current control), may be secondarily controlled so that a power (i.e., $P_{batt}=V_{batt} \times I_{batt}$) is constant (e.g., 3.3 kW) (i.e., constant power control), and may be finally controlled so that the measure voltage $V_{batt}$ of the EV battery is constant (e.g., 410V) (i.e., constant voltage control). That is, a constant current charging period, a constant power charging period, and a constant voltage charging period may be sequentially present in the charging process, and the charging process may also be referred to as 'CC-CP-CV control'. Here, the constant current control may be abbreviated as 'Constant Current (CC)', the constant power control may be abbreviated as 'Constant Power (CP)', and the constant voltage control may be abbreviated as 'Constant Voltage (CV)'.

Meanwhile, a variable for controlling the switching time points (or, starting points) of the switches (i.e., the fifth switch and the sixth switch) included in the bridgeless rectifier of FIG. 4 may be defined as γ [degrees]. Here, the variable γ may be defined as a phase interval from a point (e.g., 60 or 62) when a positive half period (e.g. 61 or 63) (or, a negative half period) of the reception-side equivalent output voltage $V_{o,ac}$ (or, the output voltage of the reception-side resonance circuit of FIG. 4) starts to a center of the phase interval according to the variable β.

As another embodiment, a variable for controlling the switching time points (or, starting points) of the switches (i.e., the fifth switch and the sixth switch) included in the bridgeless rectifier of FIG. 4 may be defined as α [degrees]. Here, the control variable α may be defined as a phase interval from a point (e.g., 60 or 62) when a positive half period (e.g. 61 or 63) (or, a negative half period) of the reception-side equivalent output voltage $V_{o,ac}$ (or, the output voltage of the reception-side resonance circuit of FIG. 4) starts to a point when the phase interval according to the variable β starts (or, the starting time point at which each of the switches included in the bridgeless rectifier starts to operate).

In this case, as shown in FIG. 6A, when the switching duty of the bridgeless rectifier is controlled such that the phase interval according to the variable β is located right in the middle of the positive half period of the reception-side output voltages $V_{o,ac}$, the variable γ may become 90°, and a reactance component may not exist in the reception-side equivalent output impedance $Z_{o,ac}$. Specifically, since the control variable γ is 90°, the fifth switch SW5 may operate in ON state at a point of 90° from a point when the positive half period of the reception-side equivalent output voltages $V_{o,ac}$ starts (or, at a center of the positive half period). Also, the sixth switch SW6 may operate in ON state at a point of 90° from a point when the negative half period of the reception-side equivalent output voltages $V_{o,ac}$ starts (or, at a center of the negative half period). Also, since the control variable β is 30°, the phase interval for which the each of fifth switch SW5 and the sixth switch SW6 operates in ON state may become 30°.

Here, the absence of the reactance component means that there is no phase difference between the reception-side induced current $I_{o,ac}$ and the reception-side output voltage $V_{o,ac}$ (or, the fundamental wave $V_{o,ac1}$ of the reception-side output voltage), and the transmission-side resonance frequency and the reception-side resonance frequency may coincide with each other. Therefore, when there is no resonance frequency variation even if the alignment state between the transmission pad and the reception pad changes, the switching time points of the bridgeless rectifier may be maintained so that the control variable γ is 90°, and only the switching duty of the bridgeless rectifier may be changed according to the variable β, thereby compensating for the voltage fluctuation of the EV battery.

However, when the transmission-side resonance frequency and the reception-side resonance frequency become different from each other, a reactance component may be generated at the reception-side equivalent output impedance $Z_{o,ac}$. For example, when the switching time points of the bridgeless rectifier are controlled so that the variable γ is larger than 90°, the reception-side equivalent output impedance may be inductive. On the other hand, when the switching time points of the bridgeless rectifier are controlled so that the variable γ is less than 90°, the reception-side equivalent output impedance may be capacitive.

Referring to FIG. 6B, a case where the switching control for the bridgeless rectifier is performed so that the output impedance becomes inductive from the control state according to FIG. 6A may be confirmed. Specifically, by controlling the switching time points of the bridgeless rectifier so that the control variable γ becomes larger than 90° (or by increasing the control variable α as compared to FIG. 6A), the fundamental wave $V_{o,ac1}$ of the reception-side output voltage $V_{o,ac}$ leads the reception-side output current $I_{o,ac}$, so that the output impedance $Z_{o,ac}$ may become inductive. For example, the fifth switch SW5 may operate in ON state at a point later than 90° from a time point when the positive half period of the reception-side equivalent output voltage $V_{o,ac}$ starts. That is, the fifth switch may have a phase lagging the switching time point of the FIG. 6A. Also, the sixth switch SW6 may operate in ON state at a point later than 90° from a time point when the negative half period of the reception-side equivalent output voltage $V_{o,ac}$ starts. That is, the sixth switch may have a phase lagging the switching time point of the FIG. 6A.

Referring to FIG. 6C, a case where the switching control for the bridgeless rectifier is performed so that the output impedance becomes capacitive from the control state according to FIG. 6A may be confirmed. Specifically, by controlling the switching time points of the bridgeless rectifier so that the control variable γ becomes less than 90° (or by decreasing the control variable α as compared to FIG. 6A), the fundamental wave $V_{o,ac1}$ of the reception-side output voltage $V_{o,ac}$ lags the reception-side output current $I_{o,ac}$, so that the output impedance $Z_{o,ac}$ may become capacitive. For example, the fifth switch SW5 may operate in ON state at a point earlier than 90° from a time point when the positive half period of the reception-side equivalent output voltage $V_{o,ac}$ starts. That is, the fifth switch may have a phase leading the switching time point of the FIG. 6A. Also, the sixth switch SW6 may operate in ON state at a point earlier than 90° from a time point when the negative half period of the reception-side equivalent output voltage $V_{o,ac}$ starts. That is, the sixth switch may have a phase leading the switching time point of the FIG. 6A.

In this case, the output impedance $Z_{o,ac}$ may affect the transmission-side input impedance $Z_{in}$ in the form of reflected impedance, as shown in the equivalent circuit according to FIG. 5.

Therefore, in order to control the reception-side output impedance $Z_{o,ac}$ to a desired value (i.e., an output impedance for zeroing the phase difference between the transmission-side and the reception-side, or an output impedance for making the resonance frequencies of the transmission-side and the reception-side coincide with each other), the switching operation of the bridgeless rectifier 42 at the reception-side is required to be synchronized with the switching operation at the full bridge inverter 40 on the transmission-side. Accordingly, methods for synchronizing the switching operation of the bridgeless rectifier with the transmission-side will be described below.

Figure 7:
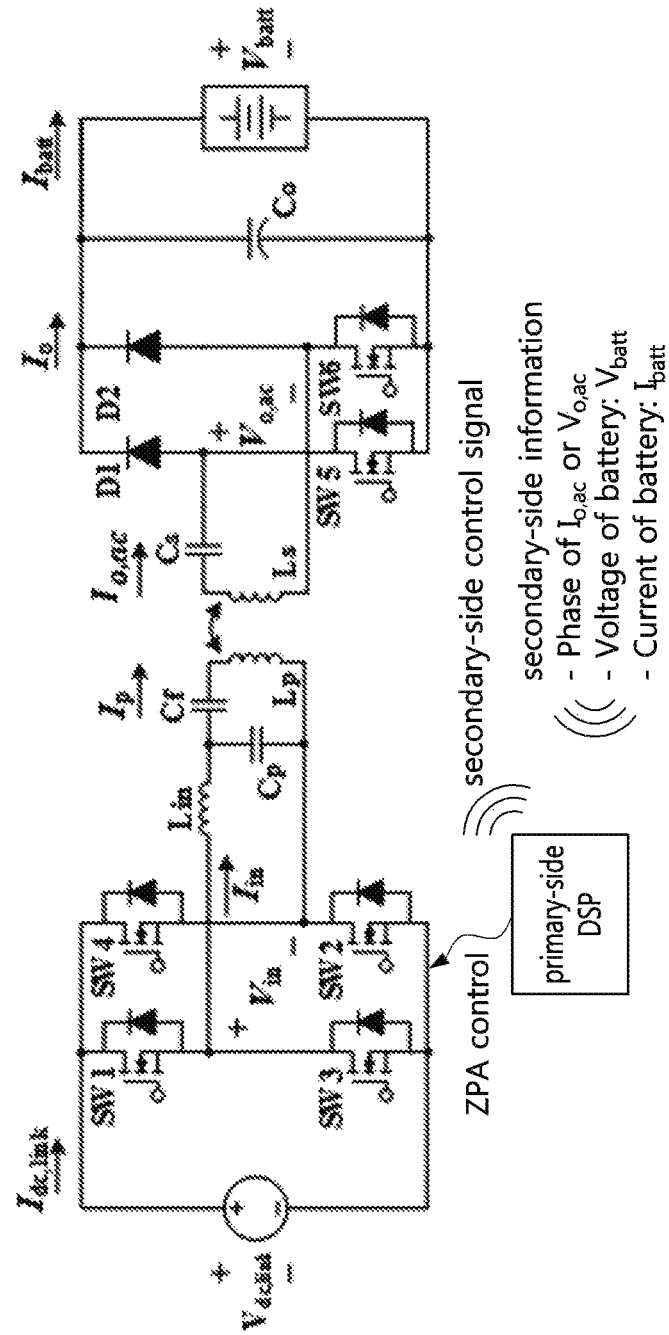
FIG. 7 is a diagram illustrating a case where control is performed at a transmission-side of the WPT system to synchronize a reception-side bridgeless rectifier with the transmission-side of the WPT system according to embodiments of the present disclosure.

FIG. 7 is a diagram illustrating a case where control is performed at a transmission-side to synchronize a reception-side bridgeless rectifier with a transmission-side according to embodiments of the present disclosure.

Referring to FIG. 7, an example of a case where the switching operations are controlled by the transmission-side may be identified.

Specifically, the transmission-side (e.g., the charging station) may be required to receive, from the reception-side, the phases of the reception-side output current $I_{o,ac}$ or the reception-side output voltages $V_{o,ac}$, or the voltage $V_{batt}$ or the current $I_{batt}$ of the EV battery current located in the reception-side.

Also, the transmission-side may determine the switching cycle (or switching frequency), the switching duty (or, the control variable β) and the switching time point (or, the control variable γ or α) within one switching period of the bridgeless rectifier, may generate a control signal by using the determined information, and may transmit the generated control signal to a processor of the reception-side (e.g., the EV or a processor of the EV).

Figure 8:
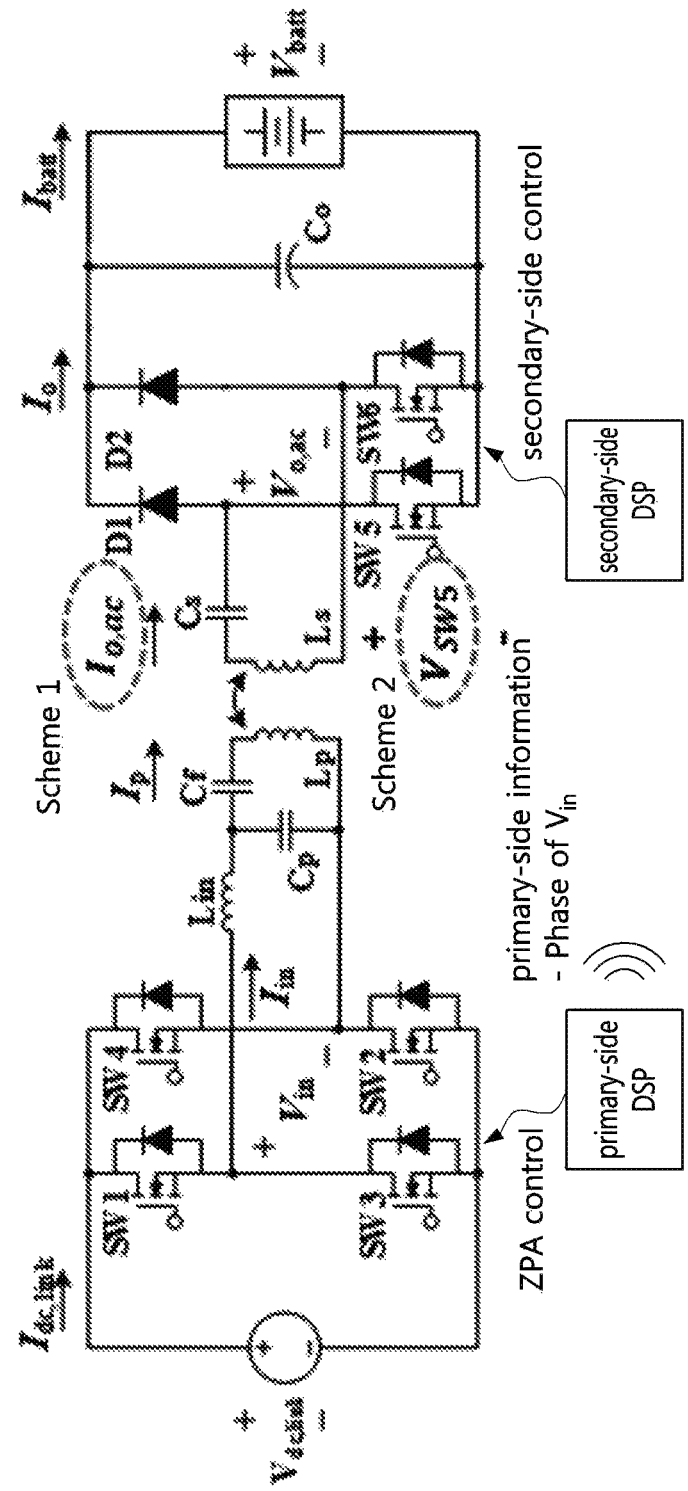
FIG. 8 is a diagram illustrating a first scheme and a second scheme for controlling a bridgeless rectifier at a reception-side of the WPT system according to embodiments of the present disclosure.
Figure 9:
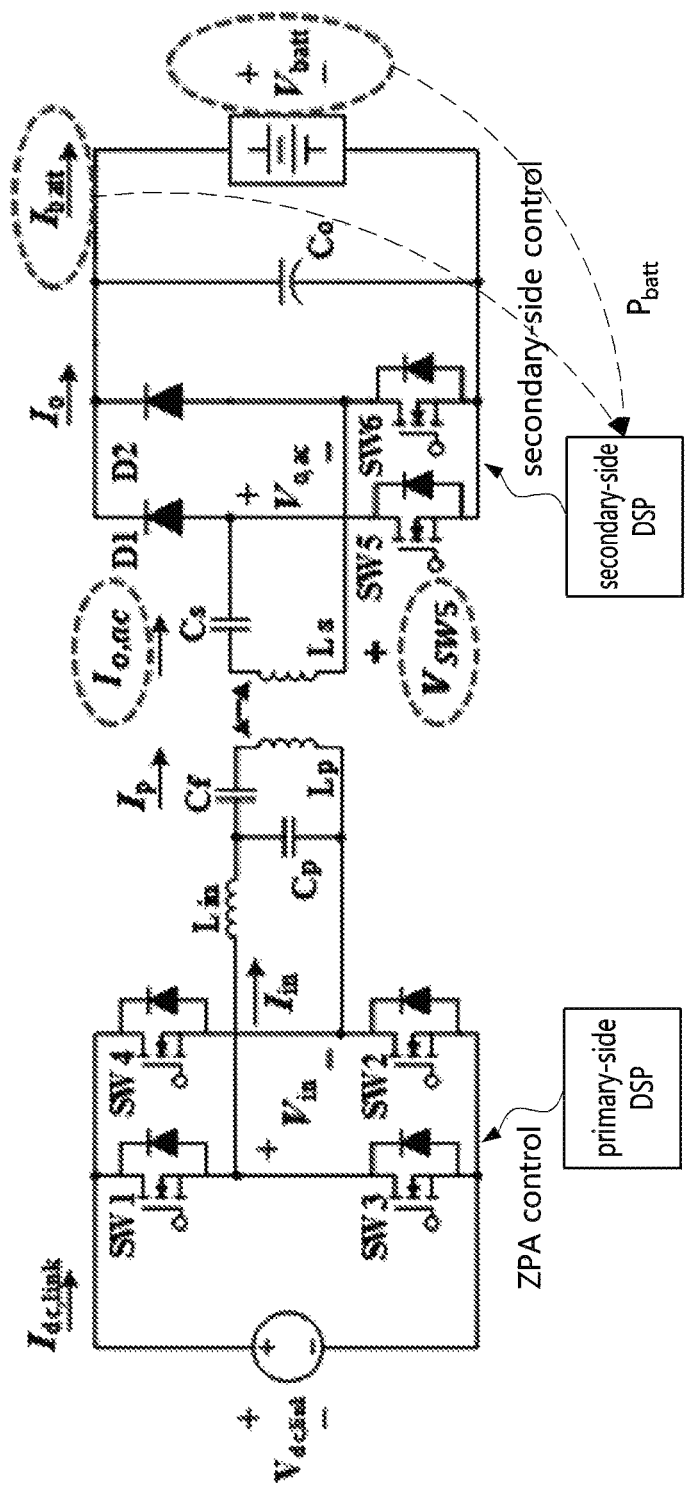
FIG. 9 is a diagram illustrating a third scheme for controlling a bridgeless rectifier at a reception-side according to embodiments of the present disclosure.

FIG. 8 is a diagram illustrating a first scheme and a second scheme for controlling a bridgeless rectifier at a reception-side according to embodiments of the present disclosure, and FIG. 9 is a diagram illustrating a third scheme for controlling a bridgeless rectifier at a reception-side according to embodiments of the present disclosure.

Referring to FIG. 8, a method of performing switching control for the bridgeless rectifier at the reception-side (or, an EV) may be identified.

Similarly to the assumption described above, the full bridge inverter 40 of the WPT system according to FIG. 4 may be assumed to be controlled at a duty ratio of 50%, and the switching frequencies of the four switches SW1, SW2, SW3, and SW4 included in the full bridge inverter 40 may be assumed to be controlled in accordance with the transmission-side resonance frequency, so that the input voltage $V_{in}$ and the input current $I_{in}$ for the transmission-side resonance circuit 41a of FIG. 4 are in the same phase (i.e., have the same phase) (i.e., zero phase angle (ZPA) operation). However, embodiments of the present disclosure are not applicable only under such the assumption. That is, the embodiments of the present disclosure should be construed as being applicable to other control situations of the full bridge inverter 40 as well.

Referring to FIG. 8 under such the assumption, the reception-side (or, the processor of the EV) may detect the reception-side output current $I_{o,ac}$ and perform switching control synchronized with the transmission-side (or, the transmission-side full bridge inverter) by using the detected output current $I_{o,ac}$. Hereinafter, this scheme may be referred to as a 'Scheme 1'.

Also, the reception-side (or, the processor of the EV) may detect the voltage $V_{SW5}$ applied to the fifth switch SW5 included in the bridgeless rectifier, and perform switching control synchronized with the transmission-side for the bridgeless rectifier by using the detected voltage. Hereinafter, this scheme may be referred to as a 'Scheme 2'. Here, in Scheme 1 and Scheme 2, the reception-side may receive from the transmission-side the input voltage $V_{in}$ of the transmission-side resonance circuit for synchronization with the transmission-side. Since the reception-side does not receive any information other than the input voltage $V_{in}$ from the transmission-side, these schemes have an advantage of performing synchronization by exchanging only the minimum information.

On the other hand, referring to FIG. 9, the reception-side (or, the processor of the EV) may detect the voltage $V_{batt}$ and the current $I_{batt}$ of the EV battery, and perform switching control synchronized with the transmission-side for the bridgeless rectifier by using the output power $P_{batt}$ of the EV battery, which is identified based on the detected voltage $V_{batt}$ and current $I_{batt}$. Hereinafter, this scheme may be referred to as a 'Scheme 3'. Here, Scheme 3 may correspond to a scheme in which independent control is possible at the reception-side without receiving additional information from the transmission-side.

Hereinafter, each of Scheme 1, Scheme 2 and Scheme 3 will be described in detail.

Figure 10:
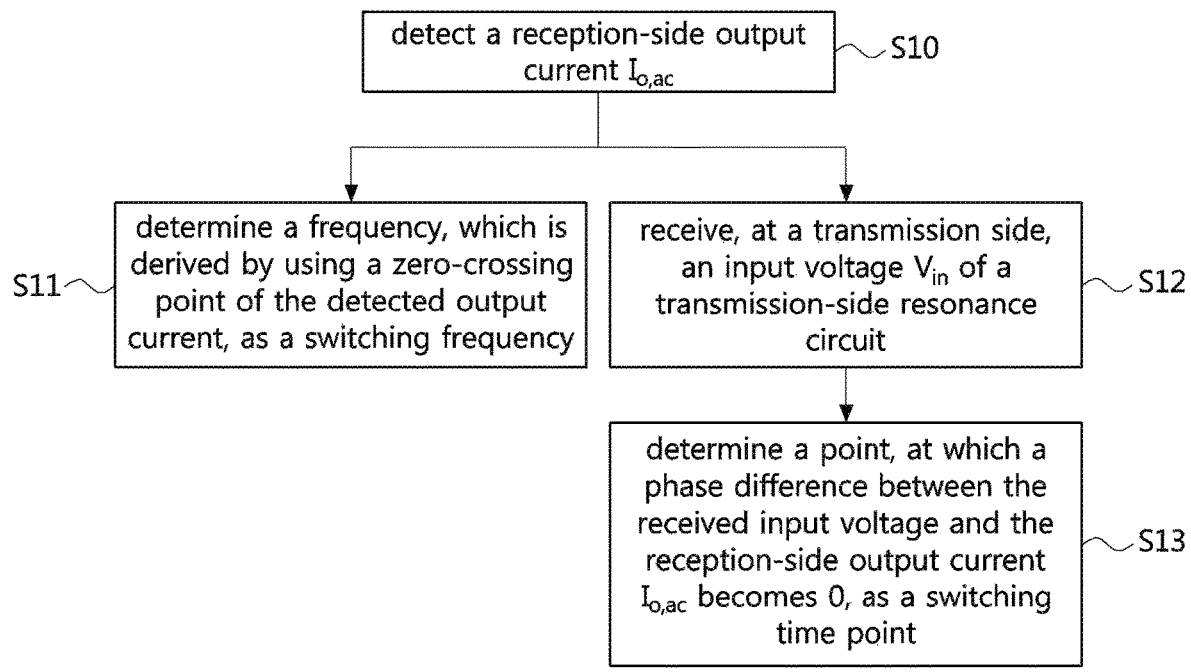
FIG. 10 is a flowchart explaining Scheme 1 for controlling a bridgeless rectifier at a reception-side according to embodiments of the present disclosure.
Figure 11:
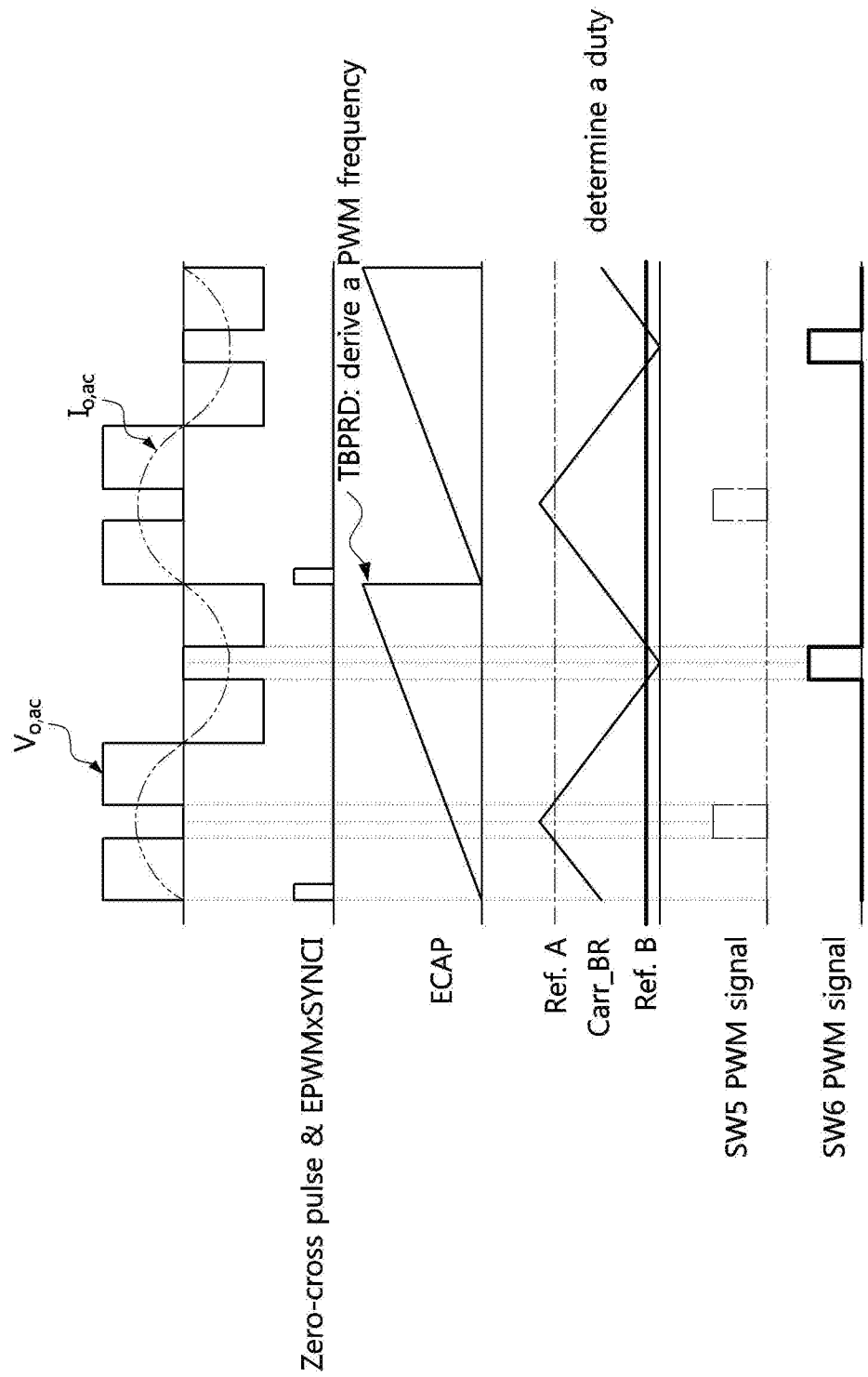
FIG. 11 is a graph illustrating a signal according to Scheme 1 according to embodiments of the present disclosure.
Figure 12:
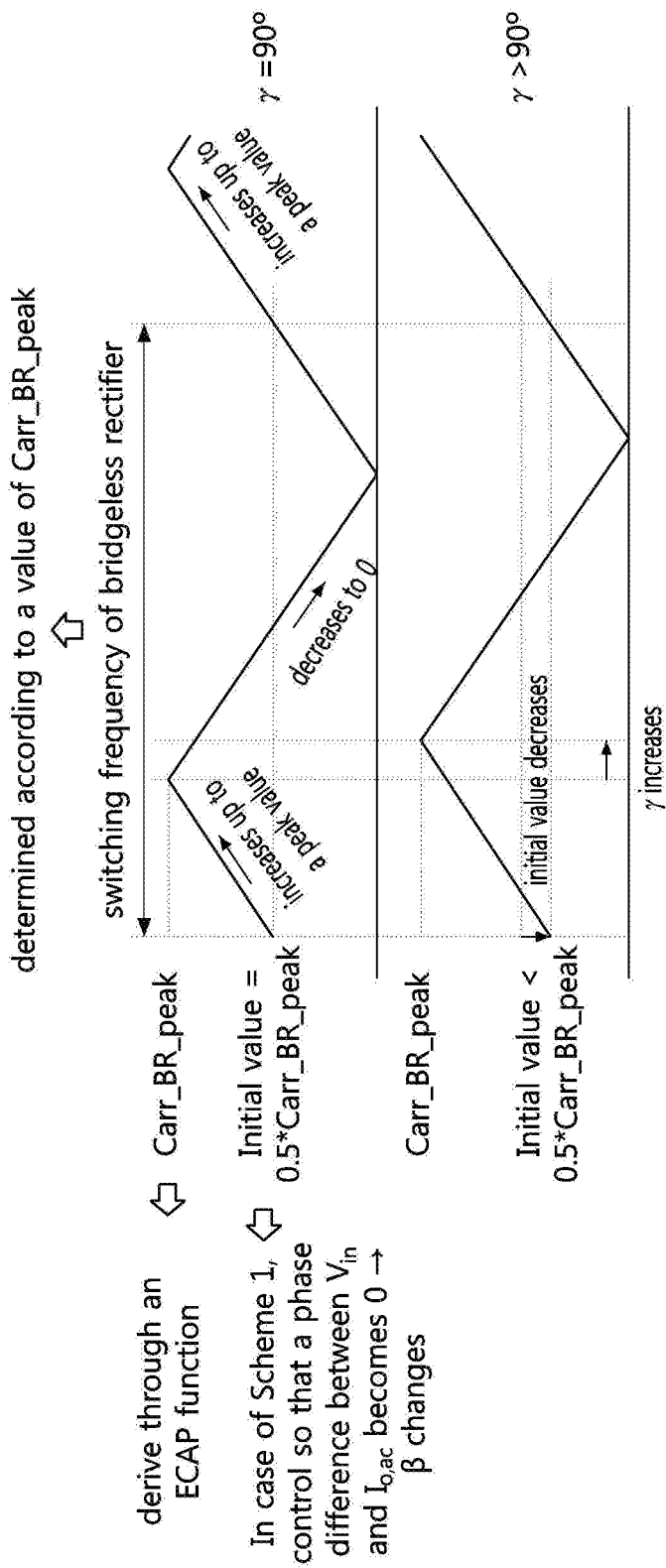
FIG. 12 is a diagram illustrating a carrier bridge signal used for switching control of a bridgeless rectifier according to embodiments of the present disclosure.

FIG. 10 is a flowchart explaining Scheme 1 for controlling a bridgeless rectifier at a reception-side according to embodiments of the present disclosure. FIG. 11 is a graph illustrating a signal according to Scheme 1 according to embodiments of the present disclosure. FIG. 12 is a diagram illustrating a carrier bridge signal used for switching control of a bridgeless rectifier according to embodiments of the present disclosure.

When the bridgeless rectifier operates as a diode rectifier, the output current $I_{o,ac}$ flowing in the reception-side resonance circuit has a zero-crossing point (a point at which a rising edge or a falling edge passes 0-axis) equal to that of the reception-side output voltage $V_{o,ac}$. Also, even when switching of the bridgeless rectifier starts, the position of the zero-crossing point does not change. Accordingly, detecting the zero-crossing point of the reception-side output current $I_{o,ac}$ has the same effect as detecting the zero-crossing point of the reception-side output voltage $V_{o,ac}$.

In Scheme 1 using this effect, the reception-side may detect the reception-side output current $I_{o,ac}$ (S10). Then, the reception-side may determine a switching frequency of the bridgeless rectifier by deriving a frequency using a zero-crossing point of the detected output current (S11). More specifically, the reception-side may identify the zero-crossing point for the detected output current $I_{o,ac}$, and then generate a pulse at the identified zero-crossing point. The reception-side may measure a time interval between the rising edges (or falling edges) of the generated pulses, and derive a frequency corresponding to the measured time interval to derive a frequency of the reception-side output current. Here, the derived frequency may be the frequency of the reception-side output current $I_{o,ac}$, and may also be the switching frequency of the bridgeless rectifier. As an implementation example, the pulses generated at the zero-crossing points (which may be referred to as 'zero-crossing pulses') may be applied to a pin performing an enhanced capture (ECAP) function in a commercial digital signal processor (DSP), and the frequency of the output current $I_{o,ac}$ may be derived from the DSP.

Also, the reception-side may receive from the transmission-side information on the phase of the input voltage $V_{in}$ of the transmission-side resonance circuit (S12), and determine the switching time points (or, the control variable α or γ) of the bridgeless rectifier so that the phase difference between the input voltage $V_{in}$ of the transmission-side resonance circuit and the reception-side output current $I_{o,ac}$ become zero (S13). Here, the step S12 was described as performed after the step S10, but may also be performed before the step S10. As an implementation example, the zero-crossing pulses may be applied to a pin performing a PWM synchronization (e.g., 'EPWMxSYNCI') function in a commercial DSP, and the synchronization with the input voltage $V_{in}$ of the transmission-side resonance circuit may be performed, so that the switching time points (or, the control variable α or γ) of the bridgeless rectifier can be determined.

Meanwhile, although not shown in the drawings, the reception-side may detect the output voltage $V_{batt}$ applied to the EV battery, and may determine the switching duty (or, the control variable β) of the bridgeless rectifier by comparing the detected output voltage $V_{batt}$ with the rated voltage of the EV battery according to the design requirement. For example, when the detected output voltage $V_{batt}$ of the EV battery is lower than the design requirement, the switching duty of the bridgeless rectifier may be controlled to increase, and when the detected output voltage $V_{batt}$ of the EV battery is higher than the design requirement, the switching duty of the bridgeless rectifier may be controlled to decrease.

An example of implementing Scheme 1 according to FIG. 10 may be referred to FIG. 11. Referring to FIG. 11, switching signals (i.e., SW5 PWM signal, SW6 PWM signal) for the bridgeless rectifier (or the fifth switch and the sixth switch included in the bridgeless rectifier in FIG. 4), which are generated according to Scheme 1, may be identified.

First, the reception-side may detect the reception-side output current $I_{o,ac}$, and identify the zero-crossing pulse generated at the point where the rising edge of the output current $I_{o,ac}$ meets 0-axis (i.e., the zero-crossing point).

Also, the generated pulse may be applied to the pin performing the ECAP function, a time counter value may start to increase from when a rising edge of the generated pulse is detected, and the time counter value may be stopped at the next rising edge so as to derive the frequency for the output current.

According to embodiments of the present disclosure, a carrier bridge signal Carr_BR may be used to determine the switching duty and the switching time points of the bridgeless rectifier. Referring to the fourth graph in FIG. 11, the carrier bridge signal for determining the switching duty and the switching time points may be determined between a first reference value Ref.A for determining a switching operation signal for the fifth switch and a second reference value Ref.B for determining a switching operation signal for the sixth switch.

Specifically, the carrier bridge signal Carr-BR may be used to generate the operation signals for the fifth switch SW5 and the sixth switch SW6, by being compared with the first reference value Ref.A for determining the switching duty of the fifth switch and the second reference value Ref.B for determining the switching duty of the sixth switch. For example, as shown in the lower part of FIG. 11, when the magnitude of the carrier bridge signal Carr_BR is larger than the first reference value Ref.A, the fifth switch SW5 (i.e., SW5 PWM signal) may operate in ON state, and when the magnitude of the carrier bridge signal Carr_BR is smaller than the second reference value Ref.B, the sixth switch SW6 (i.e., SW6 PWM signal) may operate in ON state. The carrier bridge signal Carr_BR may be generated independently of the first reference value and the second reference value.

Meanwhile, in order to perform switching control of the bridgeless rectifier using the carrier bridge signal Carr_BR, it is necessary to determine a peak value, a frequency, and an initial value of the carrier bridge signal Carr_BR.

Referring to FIG. 12, the carrier bridge signal Carr_BR has a form of a triangular wave which rises from an initial value to a peak value, then decreases until the size becomes 0, and then increases again to the peak value.

First, the frequency of the carrier bridge signal Carr_BR may have the same frequency as the frequency of the output current $I_{o,ac}$ derived using the ECAP function. In addition, a peak value Carr_BR_peak of the carrier bridge signal Carr_BR may be determined according to the frequency of the output current $I_{o,ac}$.

Also, an initial value of the carrier bridge signal Carr_BR may be determined according to the variable γ for controlling the switching time points. Here, the control variable γ may be determined so that the phase difference between the input voltage $V_{in}$ of the transmission-side resonance circuit and the reception-side output current $I_{o,ac}$ becomes zero, as described above.

For example, when the control variable γ is 90°, the initial value may have a value corresponding to ½ of the peak value. Also, when the control variable γ is larger than 90°, the initial value may be less than the value corresponding to ½ of the peak value. Also, when the control variable γ is less than 90°, the initial value may be larger than the value corresponding to ½ of the peak value. Referring to the upper graph of FIG. 12, when the control variable γ is 90°, the initial value is set to the value corresponding to ½ of the peak value, and the peak value is located at the center of the half period. Also, referring to the lower graph of FIG. 12, when the control variable γ is larger than 90°, the initial value is set to the value less than ½ of the peak value, and the peak value may be located at a point lagging the point of the upper graph. That is, the initial value of the carrier bridge signal may determine the switching time points of the bridgeless rectifier.

Also, the first reference value Ref.A for determining the switching duty of the fifth switch and the second reference value Ref.B for determining the switching duty of the sixth switch may vary depending on the output voltage of the EV battery. For example, when the output voltage of the EV battery is lower than the design requirement, the switching duty should be increased, so that the first reference value Ref.A may be made smaller and the second reference value Ref.B may be made larger. As a specific implementation example, a difference value between the output voltage $V_{batt}$ of the EV battery and the design required voltage $V_{batt\_ref}$ of the EV battery may be input to a proportional-integral (PI) controller) to determine the switching duty, and the first reference value and the second reference value may be determined using the determined switching duty.

The first reference value Ref.A may be determined according to Equation 5 below using the switching duty and the peak value Carr_BR_peak of the carrier bridge signal which are determined above.

Ref.*A*=Carr_BR_peak*[1−Duty]  [Equation 5]

Referring to Equation 5, it can be seen that the first reference value Ref.A decreases as the switching duty increases.

The second reference value Ref.B may be determined according to Equation 6 below using the switching duty and the peak value Carr_BR_peak of the carrier bridge signal.

Ref.*B*=Carr_BR_peak*Duty  [Equation 6]

Referring to Equation 6, it can be seen that the second reference value Ref.B increases as the switching duty increases.

Figure 13:
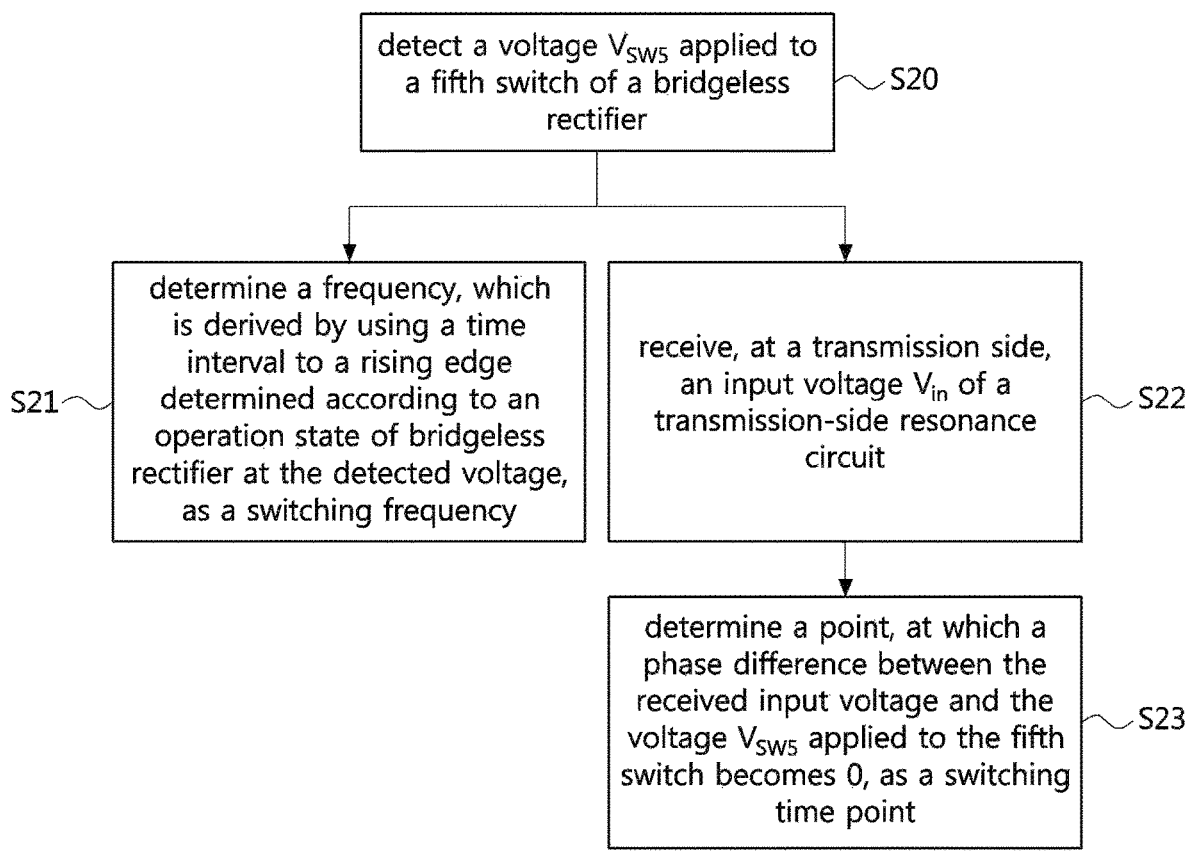
FIG. 13 is a flowchart explaining Scheme 2 for controlling a bridgeless rectifier at a reception-side according to embodiments of the present disclosure.
Figure 14:
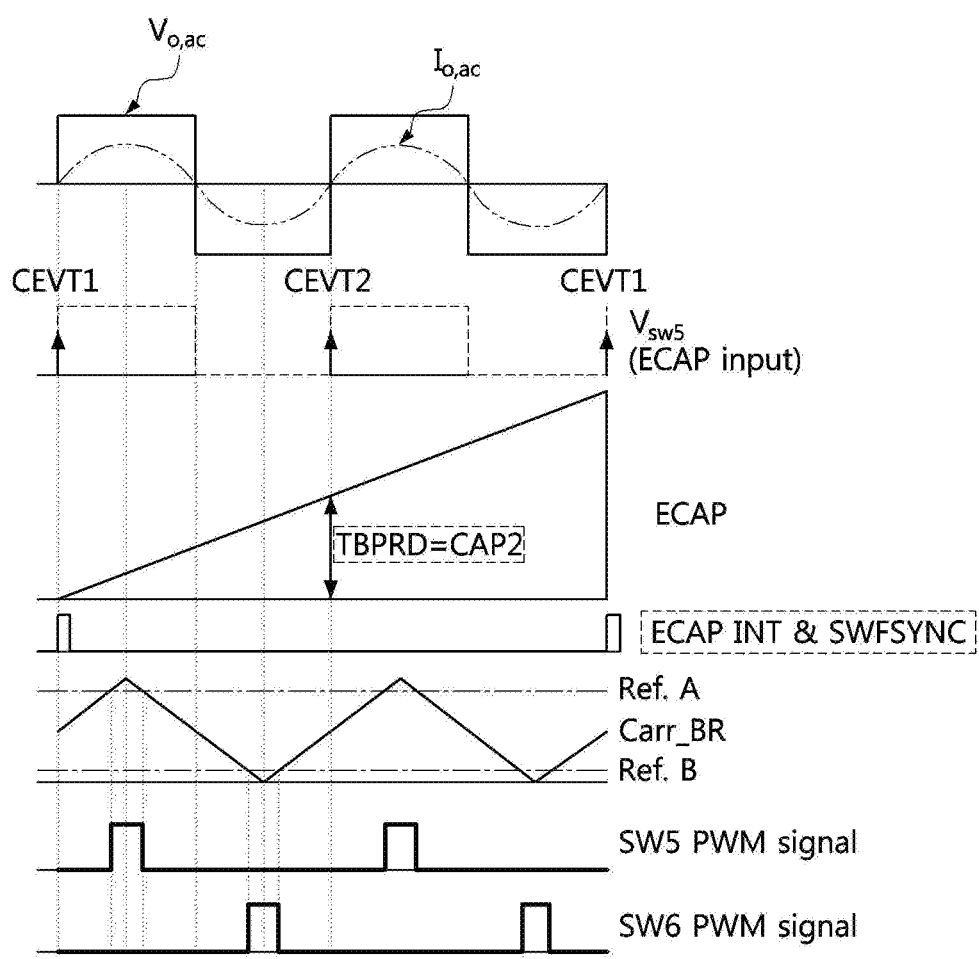
FIG. 14 is a first graph illustrating a signal according to Scheme 2 according to embodiments of the present disclosure.
Figure 15:
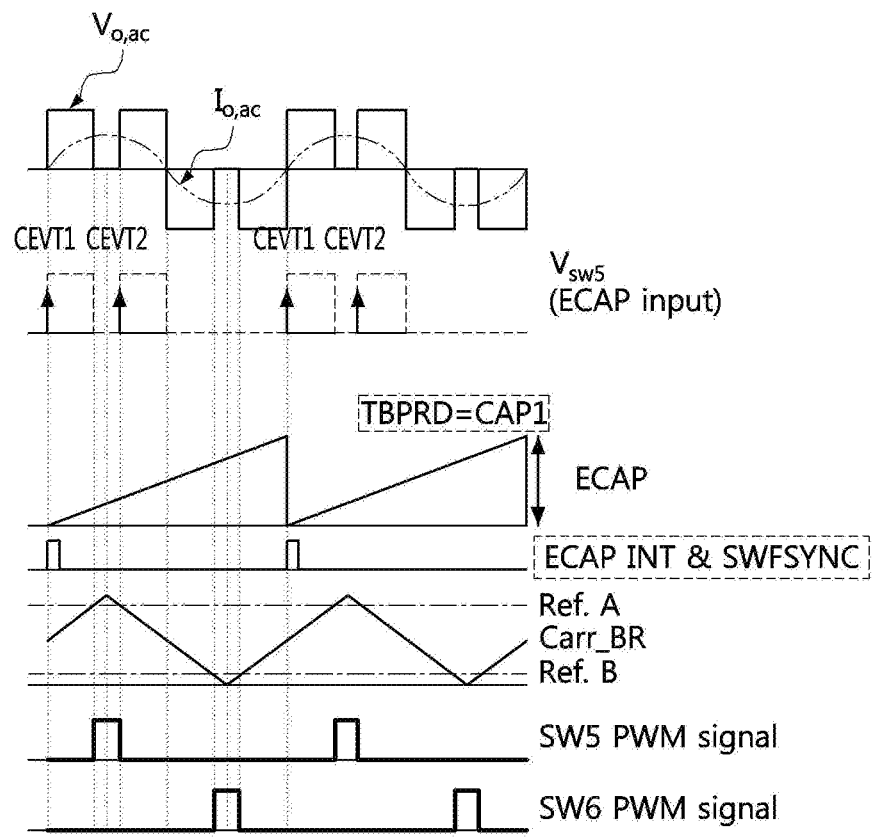
FIG. 15 is a second graph illustrating a signal according to Scheme 2 according to embodiments of the present disclosure.

FIG. 13 is a flowchart explaining Scheme 2 for controlling a bridgeless rectifier at a reception-side according to embodiments of the present disclosure. FIG. 14 is a first graph illustrating a signal according to Scheme 2 according to embodiments of the present disclosure. FIG. 15 is a second graph illustrating a signal according to Scheme 2 according to embodiments of the present disclosure.

The voltage applied to the fifth switch included in the bridgeless rectifier has a waveform corresponding to the positive half period of the reception-side output voltage. Using this characteristic, Scheme 2 of detecting the voltage applied to the fifth switch (SW5 shown in FIG. 4) of the bridgeless rectifier may be proposed.

Referring to FIG. 13, in Scheme 2 according to embodiments of the present disclosure, the reception-side may detect the voltage applied to the fifth switch of the bridgeless rectifier (S20). Then, the reception-side may determine a frequency, which is derived by using a time interval to a rising edge determined according to an operation mode of the bridgeless rectifier at the detected voltage, as a switching frequency. Here, the operation mode of the bridgeless rectifier may be classified into a case in which the switches of the bridgeless rectifier are in OFF state and a case in which the switches of the bridgeless rectifier operate in ON state in accordance with a switching cycle.

Referring to FIG. 14, the fifth switch voltage $V_{SW5}$ detected when the switches of the bridgeless rectifier are in OFF state and a process of generating a switch control signal may be identified.

Referring to the upper second graph in FIG. 14, it may be identified that the fifth switch voltage $V_{SW5}$ appears every positive half period of the reception-side output voltage $V_{o,ac}$. Here, the first rising edge is shown as CEVT1, the second rising edge is shown as CEVT2, and these two rising edges CEVT1 and CEVT2 appear repeatedly. When the switches of the bridgeless rectifier are in OFF state, a time interval to the second rising edge CEVT2 should be one period. Therefore, a time interval to the second rising edge CEVT2 of the fifth switch voltage is measured, a frequency corresponding to the measured time interval is derived, and a frequency of the reception-side output voltage $V_{o,ac}$ may be derived using the frequency corresponding to the measured time interval. The upper third graph in FIG. 14 represents a cumulative time counter value for measuring the time interval. As an implementation example, when the fifth switch voltage is applied to a pin performing an ECAP function in a commercial DSP and the second rising edge is configured as a signal to be counted, the frequency of the reception-side output voltage $V_{o,ac}$ may be derived. The frequency derived here may be the switching frequency of the bridgeless rectifier.

Referring to FIG. 15, the fifth switch voltage $V_{SW5}$ detected when the switches of the bridgeless rectifier operate in ON state according to the switch cycle and a process of generating a switch control signal may be identified.

Referring to the upper second graph in FIG. 15, it may be identified that the fifth switch voltage $V_{SW5}$ appears every positive half period of the reception-side output voltage $V_{o,ac}$. Here, the first rising edge is shown as CEVT1, the second rising edge is shown as CEVT2, and these two rising edges CEVT1 and CEVT2 appear repeatedly. When the switches of the bridgeless rectifier operate in ON state according to the switching cycle, a time interval to the first rising edge CEVT1 should be one period. Therefore, a time interval to the first rising edge CEVT1 of the fifth switch voltage is measured, a frequency corresponding to the measured time interval is derived, and a frequency of the reception-side output voltage $V_{o,ac}$ may be derived using the frequency corresponding to the measured time interval. The upper third graph in FIG. 5 represents a cumulative time counter value for measuring the time interval. As an implementation example, when the fifth switch voltage is applied to a pin performing an ECAP function in a commercial DSP and the first rising edge is configured as a signal to be counted, the frequency of the reception-side output voltage $V_{o,ac}$ may be derived. The frequency derived here may be the switching frequency of the bridgeless rectifier.

Referring back to FIG. 13, similarly to Scheme 1, the reception-side may receive from the transmission-side information on the phase of the input voltage $V_{in}$ of the transmission-side resonance circuit (S22), and determine the switching time points (or, the control variable α or γ) of the bridgeless rectifier so that the phase difference between the input voltage $V_{in}$ of the transmission-side resonance circuit and the fifth switch voltage $V_{SW5}$ becomes zero (S23). Here, the step S22 was described as performed after the step S20, but may also be performed before the step S20. As an implementation example, the detected fifth switch voltage $V_{SW5}$ may be applied to a pin performing a PWM synchronization (e.g., 'EPWMxSYNCI') function in a commercial DSP, and the synchronization with the input voltage $V_{in}$ of the transmission-side resonance circuit may be performed, so that the switching time points (or, the control variable $\alpha$ or $\gamma$) of the bridgeless rectifier can be determined.

In this case, the carrier bridge signal described in FIG. 11 may be used to determine the switching time points and switching duty of the bridgeless rectifier. In FIGS. 14 and 15, the lower third graph shows the carrier bridge signal, the first reference value, and the second reference value. The criteria for determining the carrier bridge signal are the same as those described with reference to FIG. 11, and thus a detailed description thereof will be omitted.

When the switching time points, the duty, and the switching frequency of the bridgeless rectifier are determined, switching operation signals shown in the bottom two graphs of FIGS. 14 and 15 (above for the fifth switch and below for the sixth switch) may be generated.

Figure 16:
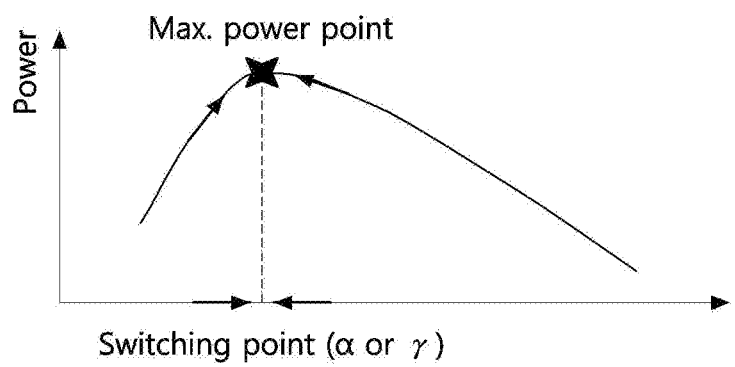
FIG. 16 is a graph explaining a concept of Scheme 3 for controlling a bridgeless rectifier at a reception-side of the WPT system according to embodiments of the present disclosure.

FIG. 16 is a graph explaining a concept of Scheme 3 for controlling a bridgeless rectifier at a reception-side according to embodiments of the present disclosure.

Scheme 3 according to embodiments of the present disclosure may determine the switching duty and the switching frequency in the same manner as Scheme 1 and Scheme 2 described above. However, unlike Scheme 1 and Scheme 2, Scheme 3 has an advantage of determining the switching time points using only information available at the reception-side, and an advantage of not receiving from the transmission-side any information (e.g., input voltage $V_{in}$ of the transmission-side resonance circuit). Accordingly, since Scheme 3 uses only information available at the reception-side, there is an advantage that the bridgeless rectifier can be controlled independently from the transmission-side.

Specifically, in Scheme 1 and Scheme 2 described above, the switching time points (or, the control variable $\alpha$ or $\gamma$) of the bridgeless rectifier are determined so that he phase difference between the input voltage $V_{in}$ of the transmission-side resonance circuit and the reception-side output current $I_{o,ac}$ or the fifth switch voltage $V_{SW5}$ becomes zero.

However, in Scheme 3, the reception-side may detect the voltage $V_{batt}$ and the current $I_{batt}$ of the EV battery, and determine the switching time points (or, the control variable $\alpha$ or $\gamma$) of the bridgeless rectifier so that the output power $P_{batt}$ of the EV battery identified based on the detected voltage and current increases or becomes maximum.

Referring to FIG. 16, in Scheme 3, the maximum power point of the EV battery can be identified while changing the switching time points of the bridgeless rectifier in the arrow direction.

Using Scheme 1, Scheme 2, or Scheme 3 according to the embodiments of the present disclosure, there is no need to exchange synchronization signals for the switching synchronization between the transmission-side and the reception-side, so that they are not affected by communication delays and noises. Further, since Scheme 1 and Scheme 2 exchange only the minimum information between the transmission-side and the reception-side, it is made possible to prevent reduction in the operation speed and reduce the volume of circuits, thereby reducing the cost. Also, in Scheme 3, there is an advantage that the switching of the bridgeless rectifier can be controlled at the reception-side independently from the transmission-side without information exchange between the transmission-side and the reception-side.

Figure 17:
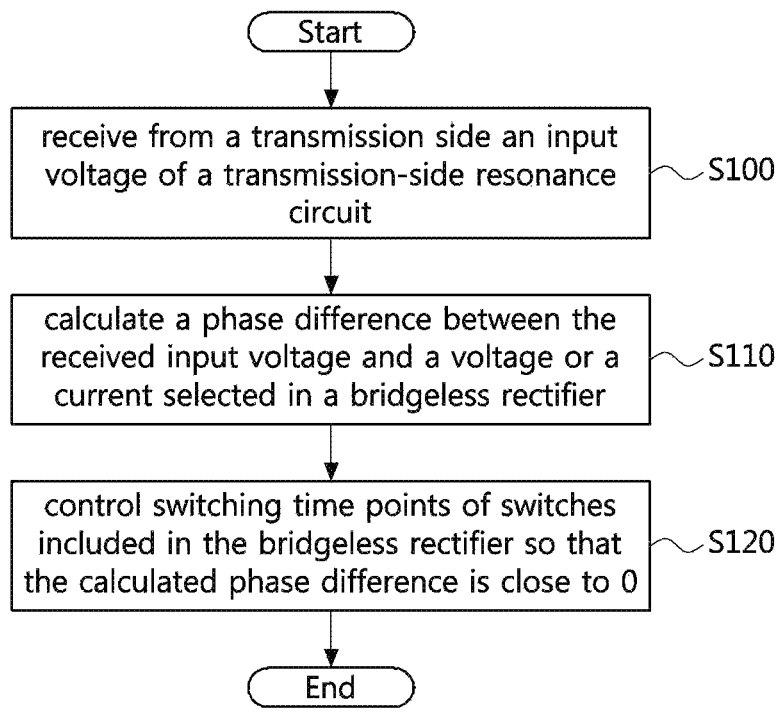
FIG. 17 is a flowchart illustrating a method for performing switching synchronization of a bridgeless rectifier in an EV WPT system according to embodiments of the present disclosure.

FIG. 17 is a flowchart illustrating a method for performing switching synchronization of a bridgeless rectifier in an EV WPT system according to embodiments of the present disclosure.

As shown in FIG. 17, a method for performing switching synchronization of a bridgeless rectifier in an EV WPT system may comprise a step S100 of receiving from a transmission-side an input voltage of a transmission-side resonance circuit, a step S110 of calculating a phase difference between the received input voltage and a voltage or a current selected in a bridgeless rectifier, and a step S120 of controlling switching time points of switches included in the bridgeless rectifier to decrease the calculated phase difference, e.g., so that the calculated phase difference is close to 0.

Here, the input voltage of the transmission-side resonance circuit may mean the input voltage $V_{in}$ to the transmission-side resonance circuit 41a in FIG. 4.

The method for performing the switching synchronization of the bridgeless rectifier may include Scheme 1 and Scheme 2 described in FIGS. 8 and 10 to 15.

The method for performing switching synchronization of the bridgeless rectifier may be performed in an EV control module. Here, the EV control module may include a digital signal processor (DSP), and may be a vehicle assembly (VA) or a VA controller, which is included in an EV and performs switching control of the bridgeless rectifier.

The reception-side resonance circuit may be electromagnetically coupled to the transmission-side resonance circuit.

The bridgeless rectifier may rectify the output of the reception-side resonance circuit and output the rectified output. The bridgeless rectifier may include a first rectifier circuit in which a first diode and a first switch are connected in series and a second rectifier circuit in which a second diode and a second switch are connected in series. Here, the first diode may denote the first diode D1 according to FIG. 4, the first switch may denote the fifth switch SW5 according to FIG. 4, the second diode may denote the second diode D2 according to FIG. 4, and the second switch may denote the sixth switch SW6 according to FIG. 4. The first rectifier circuit and the second rectifier circuit may be connected in parallel with each other.

The step S110 may comprise a step of calculating a phase difference between the received input voltage and the output current of the reception-side resonance circuit.

The output current of the reception-side resonance circuit may be a current flowing in from at least one of a node between the first diode and the first switch and a node between the second diode and the second switch.

The method for performing switching synchronization of the bridgeless rectifier may further comprise a step of calculating a frequency of the output current of the reception-side resonance circuit and a step of determining the calculated frequency as a switching frequency of the switches.

The step of calculating the frequency of the output current of the reception-side resonance circuit may further comprise a step of detecting a zero-crossing point of the output current of the reception-side resonance circuit, a step of generating a pulse per the detected zero-crossing point, a step of calculating a time interval between rising edges of the generated pulses, and a step of converting the calculated time interval to the frequency of the output current of the reception-side resonance circuit.

The method for performing switching synchronization of the bridgeless rectifier may further comprise a step of detecting an output voltage of an EV battery, a step of comparing the detected output voltage with a reference voltage according to a design requirement of the EV battery, and a step of controlling a switching duty of the switches according to a result of the comparison.

In the step of controlling the switching duty, when the output voltage of the EV battery is less than the reference voltage, the switching duty may be controlled to increase.

The step S110 may further comprise a step of calculating a phase difference between the received input voltage and a voltage applied to the first switch.

The method for performing switching synchronization of the bridgeless rectifier may further comprise a step of calculating a frequency according to an operation state of the bridgeless rectifier using the voltage applied to the first switch, and a step of determining the calculated frequency as a switching frequency for the switches.

Figure 18:
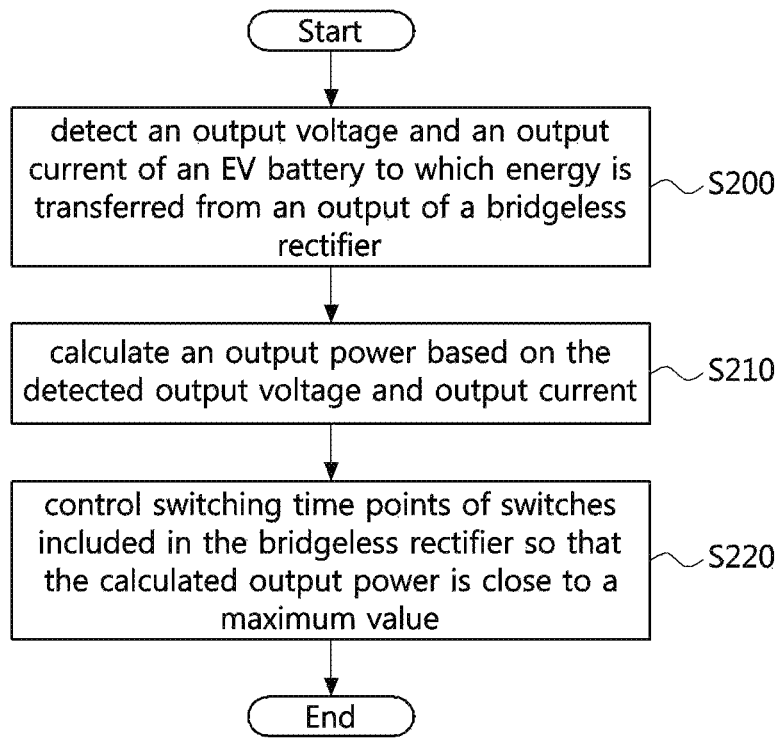
FIG. 18 is a flowchart illustrating a method for performing switching synchronization of a bridgeless rectifier in an EV WPT system independently from a transmission-side of the WPT system according to embodiments of the present disclosure.

FIG. 18 is a flowchart illustrating a method for performing switching synchronization of a bridgeless rectifier in an EV WPT system independently from a transmission-side according to embodiments of the present disclosure.

Referring to FIG. 18, a method for independently performing switching synchronization of a bridgeless rectifier in an EV WPT system may comprise a step S200 of detecting an output voltage and an output current of an EV battery to which energy is transferred from an output of the bridgeless rectifier, a step S210 of calculating an output power based on the detected output voltage and output current, and a step S220 of controlling switching time points of switches included in the bridgeless rectifier so that the calculated output power increases, e.g., close to a maximum value.

The method for independently performing the switching synchronization of the bridgeless rectifier may include Scheme 3 described in FIGS. 9 and 16.

The method for independently performing switching synchronization of the bridgeless rectifier may be performed in an EV control module. Here, the EV control module may include a digital signal processor (DSP), and may be a vehicle assembly (VA) or a VA controller, which is included in an EV and performs switching control of the bridgeless rectifier.

The bridgeless rectifier may include a first rectifier circuit in which a first diode and a first switch are connected in series and a second rectifier circuit in which a second diode and a second switch are connected in series. Here, the first diode may denote the first diode D1 according to FIG. 4, the first switch may denote the fifth switch SW5 according to FIG. 4, the second diode may denote the second diode D2 according to FIG. 4, and the second switch may denote the sixth switch SW6 according to FIG. 4. The first rectifier circuit and the second rectifier circuit may be connected in parallel with each other.

The method for independently performing switching synchronization of the bridgeless rectifier may further comprise a step of calculating a frequency of an output current of the reception-side resonance circuit and a step of determining the calculated frequency as a switching frequency of the switches.

The bridgeless rectifier may rectify the output of the reception-side resonance circuit and output the rectified output.

The step of calculating the frequency of the output current of the reception-side resonance circuit may further comprise a step of detecting a zero-crossing point of the output current of the reception-side resonance circuit, a step of generating a pulse per the detected zero-crossing point, a step of calculating a time interval between rising edges of the generated pulses, and a step of converting the calculated time interval to the frequency of the output current of the reception-side resonance circuit.

The method for independently performing switching synchronization of the bridgeless rectifier may further comprise a step of detecting an output voltage of an EV battery, a step of comparing the detected output voltage with a reference voltage according to a design requirement of the EV battery, and a step of controlling a switching duty of the switches according to a result of the comparison.

In the step of controlling the switching duty, when the output voltage of the EV battery is less than the reference voltage, the switching duty may be controlled to increase.

The method for independently performing switching synchronization of the bridgeless rectifier may further comprise a step of calculating a frequency according to an operation state of the bridgeless rectifier using the voltage applied to the first switch, and a step of determining the calculated frequency as a switching frequency for the switches.

Figure 19:
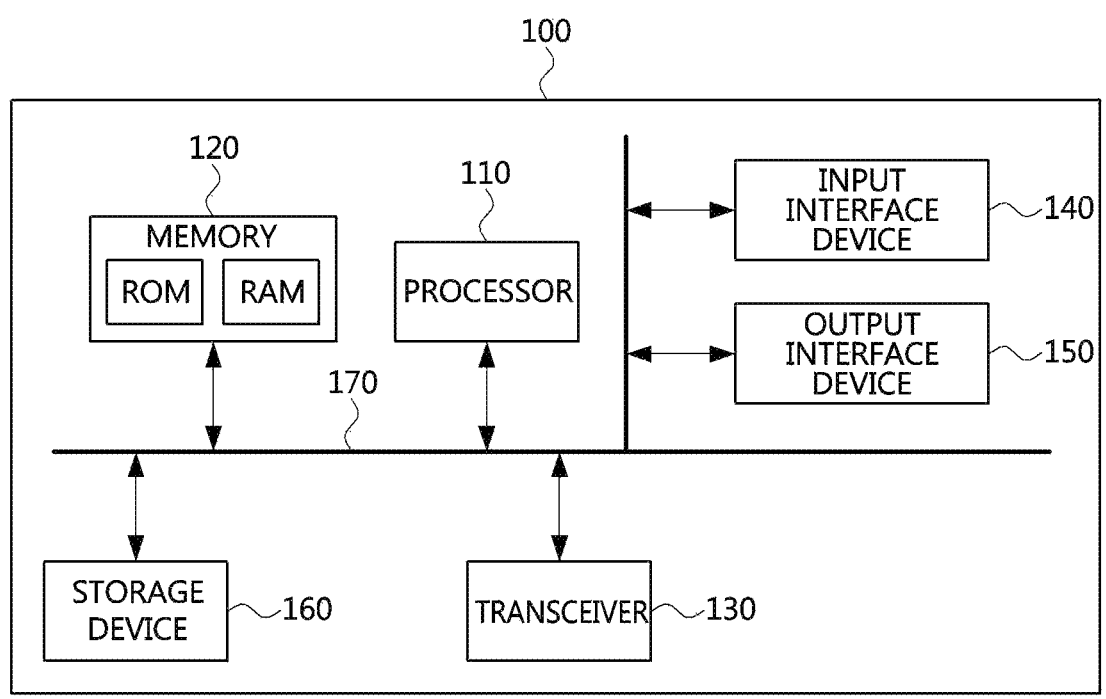
FIG. 19 is a block diagram illustrating an apparatus for performing switching synchronization of a bridgeless rectifier in an EV WPT system according to embodiments of the present disclosure.

FIG. 19 is a block diagram illustrating an apparatus for performing switching synchronization of a bridgeless rectifier in an EV WPT system according to embodiments of the present disclosure.

As shown in 19, an apparatus 100 for performing switching synchronization of a bridgeless rectifier may include a processor 110 and a memory 120 storing instructions causing the processor 110 to perform at least one step.

Also, the apparatus 100 may further include a transceiver 130 performing communications through a wireless network or a wired network. Also, the apparatus 100 may further include an input interface device 140, an output interface device 150, a storage device 160, and the like. Each component included in the apparatus 100 may be connected by a bus 170 to communicate with each other.

Here, the processor 110 may refer to a central processing unit (CPU), a graphics processing unit (GPU), or a dedicated processor on which methods according to embodiments of the present disclosure are performed. Each of the memory 120 and the storage device 160 may be constituted of at least one of a volatile storage medium and a nonvolatile storage medium. For example, the memory 120 may comprise at least one of a read only memory (ROM) and a random access memory (RAM).

The at least one step may comprise a step of receiving from a transmission-side an input voltage of a transmission-side resonance circuit, a step of calculating a phase difference between the received input voltage and a voltage or a current selected in a bridgeless rectifier, and a step of controlling switching time points of switches included in the bridgeless rectifier to decrease the calculated phase difference, e.g., so that the calculated phase difference is close to 0.

The reception-side resonance circuit may be electromagnetically coupled to the transmission-side resonance circuit, and the bridgeless rectifier may rectify the output of the reception-side resonance circuit and output the rectified output.

In addition, the apparatus 100 for performing switching synchronization of the bridgeless rectifier should be interpreted as capable of performing the steps described with reference to FIG. 17.

On the other hand, the hardware configuration shown in FIG. 19 may be utilized as an apparatus performing the method (or, Scheme 3) described with reference to FIG. 18

(hereinafter, referred to as an apparatus for independently performing switching synchronization of the bridgeless rectifier).

For example, an apparatus for independently performing switching synchronization of the bridgeless rectifier may include a processor and a memory storing instructions causing the processor to perform at least one step.

The at least one step may comprise a step of detecting an output voltage and an output current of an EV battery to which energy is transferred from an output of the bridgeless rectifier, a step of calculating an output power based on the detected output voltage and output current, and a step of controlling switching time points of switches included in the bridgeless rectifier so that the calculated output power increases, e.g., close to a maximum value.

In addition, the apparatus for independently performing switching synchronization of the bridgeless rectifier should be interpreted as capable of performing the steps described with reference to FIG. 18.

Meanwhile, the apparatus 100 for performing switching synchronization of the bridgeless rectifier may be incorporated in the EV according to FIG. 1. For example, the EV for performing switching synchronization of the bridgeless rectifier may include a processor, a memory storing instructions causing the processor to perform at least one step, a reception-side resonance circuit coupled electromagnetically with a transmission coil and receiving wireless power from the transmission coil, a bridgeless rectifier rectifying an output current of the reception-side resonance circuit and outputting the rectified current, and a battery for receiving and storing the output of the bridgeless rectifier and supplying energy to the EV.

Here, the at least one step may comprise a step of receiving from a transmission-side an input voltage of a transmission-side resonance circuit, a step of calculating a phase difference between the received input voltage and a voltage or a current selected in a bridgeless rectifier, and a step of controlling switching time points of switches included in the bridgeless rectifier to decrease the calculated phase difference, e.g., so that the calculated phase difference is close to 0.

Meanwhile, the apparatus for independently performing switching synchronization of the bridgeless rectifier may also be incorporated in the EV according to FIG. 1. For example, the EV for independently performing switching synchronization of the bridgeless rectifier may include a processor, a memory storing instructions causing the processor to perform at least one step, a reception-side resonance circuit coupled electromagnetically with a transmission coil and receiving wireless power from the transmission coil, a bridgeless rectifier rectifying an output current of the reception-side resonance circuit and outputting the rectified current, and a battery for receiving and storing the output of the bridgeless rectifier and supplying energy to the EV.

Here, the at least one step may comprise a step of detecting an output voltage and an output current of an EV battery, a step of calculating an output power based on the detected output voltage and output current, and a step of controlling switching time points of switches included in the bridgeless rectifier so that the calculated output power increases, e.g., close to a maximum value.

The methods according to embodiments of the present disclosure may be implemented as program instructions executable by a variety of computers and recorded on a computer readable medium. The computer readable medium may include a program instruction, a data file, a data structure, or a combination thereof. The program instructions recorded on the computer readable medium may be designed and configured specifically for an exemplary embodiment of the present disclosure or can be publicly known and available to those who are skilled in the field of computer software.

Examples of the computer readable medium may include a hardware device including ROM, RAM, and flash memory, which are configured to store and execute the program instructions. Examples of the program instructions include machine codes made by, for example, a compiler, as well as high-level language codes executable by a computer, using an interpreter. The above exemplary hardware device can be configured to operate as at least one software module to perform the operation of the present disclosure, and vice versa. Also, the above-described method or apparatus may be implemented by combining all or a part of the structure or functions, or may be implemented separately.

Furthermore, the above-mentioned method or apparatus may be implemented by combining all or a part of the configuration or function, or may be implemented separately.

While the embodiments of the present disclosure and their advantages have been described in detail, it should be understood that various changes, substitutions, and alterations may be made herein without departing from the scope of the present disclosure.

What is claimed is:

1. A method for performing switching synchronization of a bridgeless rectifier in an electric vehicle (EV) wireless power transfer system independently from a transmission-side of the EV wireless power transfer system, the method comprising:
    detecting, by an EV control module, an output voltage and an output current of an EV battery to which energy is transferred from an output of the bridgeless rectifier;
    calculating, by the EV control module, an output power based on the detected output voltage and output current;
    calculating, by the EV control module, a frequency of an output current of a reception-side resonance circuit;
    determining, by the EV control module, the calculated frequency as a switching frequency of the switches; and
    controlling, by the EV control module, switching time points of switches included in the bridgeless rectifier to increase the calculated output power,
    wherein the calculating of the frequency of the output current of the reception-side resonance circuit comprises:
        detecting, by the EV control module, a zero-crossing point of the output current of the reception-side resonance circuit;
        generating, by the EV control module, a pulse per the detected zero-crossing point;
        calculating, by the EV control module, a time interval between rising edges of the generated pulses; and
        converting, by the EV control module, the calculated time interval to the frequency of the output current of the reception-side resonance circuit, and
    wherein the bridgeless rectifier includes a first rectifier circuit in which a first diode and a first switch are connected in series and a second rectifier circuit in which a second diode and a second switch are connected in series, and the first rectifier circuit and the second rectifier circuit are connected in parallel with each other.

2. The method according to claim 1, further comprising:
comparing, by the EV control module, the detected output voltage with a reference voltage according to a design requirement of the EV battery; and
controlling, by the EV control module, a switching duty of the switches according to the comparison of the detected output voltage with the reference voltage.

3. The method according to claim 2, wherein the controlling of the switching duty comprises controlling, by the EV control module, the switching duty such that the switching duty increases when the output voltage of the EV battery is less than the reference voltage.

4. The method according to claim 1, further comprising:
calculating, by the EV control module, a frequency according to an operation state of the bridgeless rectifier using a voltage applied to the first switch; and
determining, by the EV control module, the calculated frequency as a switching frequency for the switches.

5. An apparatus for performing switching synchronization of a bridgeless rectifier in an electric vehicle (EV) wireless power transfer system independently from a transmission-side of the EV wireless power transfer system, the apparatus comprising:
a processor; and
a memory storing instructions executable by the processor,
wherein, when the instructions are executed, the processor is configured to:
detect an output voltage and an output current of an EV battery to which energy is transferred from an output of the bridgeless rectifier;
calculate an output power based on the detected output voltage and output current;
calculate a frequency of an output current of a reception-side resonance circuit;
determine the calculated frequency as a switching frequency of the switches; and
control switching time points of switches included in the bridgeless rectifier to increase the calculated output power;
wherein when the frequency of the output current of the reception-side resonance circuit is calculated, the processor is configured further to:
detect an output voltage and an output current of an EV battery to which energy is transferred from an output of the bridgeless rectifier;
calculate an output power based on the detected output voltage and output current; and
control switching time points of switches included in the bridgeless rectifier to increase the calculated output power, and
wherein the bridgeless rectifier includes a first rectifier circuit in which a first diode and a first switch are connected in series and a second rectifier circuit in which a second diode and a second switch are connected in series, and the first rectifier circuit and the second rectifier circuit are connected in parallel with each other.

6. An electric vehicle (EV) for independently performing switching synchronization of a bridgeless rectifier in an EV wireless power transfer system, the EV comprising:
a processor;
a memory storing instructions executable by the processor;
a reception-side resonance circuit coupled with a transmission coil and configured to receive wireless power from the transmission coil;
a bridgeless rectifier configured to rectify an output current of the reception-side resonance circuit and to output the rectified current; and
an EV battery configured to receive and store the output of the bridgeless rectifier and to supply energy to the EV,
wherein, when the instructions are executed, the processor is configured to:
detect an output voltage and an output current of an EV battery to which energy is transferred from an output of the bridgeless rectifier;
calculate an output power based on the detected output voltage and output current;
calculate a frequency of an output current of a reception-side resonance circuit;
determine the calculated frequency as a switching frequency of the switches; and
control switching time points of switches included in the bridgeless rectifier to increase the calculated output power;
wherein when the frequency of the output current of the reception-side resonance circuit is calculated, the processor is configured further to:
detect an output voltage and an output current of an EV battery to which energy is transferred from an output of the bridgeless rectifier;
calculate an output power based on the detected output voltage and output current; and
control switching time points of switches included in the bridgeless rectifier to increase the calculated output power,
wherein the bridgeless rectifier includes a first rectifier circuit in which a first diode and a first switch are connected in series and a second rectifier circuit in which a second diode and a second switch are connected in series and the first rectifier circuit and the second rectifier circuit are connected in parallel with each other.

* * * * *